(12) United States Patent
Abe et al.

(10) Patent No.: US 8,178,791 B2
(45) Date of Patent: May 15, 2012

(54) WIRING SUBSTRATE INCLUDING CONDUCTIVE CORE SUBSTRATE, AND MANUFACTURING METHOD THEREOF

(75) Inventors: Tomoyuki Abe, Kawasaki (JP); Kazumasa Saito, Kawasaki (JP); Shin Hirano, Kawasaki (JP); Kenji Iida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 585 days.

(21) Appl. No.: 12/331,113

(22) Filed: Dec. 9, 2008

(65) Prior Publication Data

US 2009/0308651 A1   Dec. 17, 2009

(30) Foreign Application Priority Data

Dec. 13, 2007   (JP) ................. 2007-321910

(51) Int. Cl.
*H05K 1/11* (2006.01)
*H01K 3/10* (2006.01)
(52) U.S. Cl. .......................................... 174/262; 29/852
(58) Field of Classification Search .......... 174/262–266; 361/792–795; 29/852–853
See application file for complete search history.

(56) References Cited

U.S. PATENT DOCUMENTS

| 5,949,030 A * | 9/1999 | Fasano et al. ............. 174/262 |
| 6,013,588 A | 1/2000 | Ozaki |
| 2006/0175084 A1 | 8/2006 | Okamoto et al. |

FOREIGN PATENT DOCUMENTS

| JP | 01-103898 | 4/1989 |
| JP | 10-107391 A | 4/1998 |
| JP | 10-326971 | 12/1998 |
| JP | 2000-133942 A | 5/2000 |
| JP | 2000-236167 A | 8/2000 |
| JP | 2002-84072 A | 3/2002 |
| JP | 2002-100869 A | 4/2002 |
| JP | 2004-140216 | 5/2004 |
| JP | 2006-128355 A | 5/2006 |
| JP | 2006-222216 | 8/2006 |

OTHER PUBLICATIONS

Japanese Office Action mailed Jan. 10, 2012, for corresponding Japanese Application No. 2007-321910, with partial English-language translation.

* cited by examiner

*Primary Examiner* — Jeremy Norris
(74) *Attorney, Agent, or Firm* — Fujitsu Patent Center

(57) ABSTRACT

A wiring substrate includes a core substrate having a first main surface and a mutually opposing second main surface, the second main surface having a conductive property. A first through hole penetrates a core substrate. A first conductive layer extends from the first main surface to the second main surface via the first through hole. An insulating layer is formed on the first conductive layer. A second through hole has the insulating layer as an interior wall. And a second conductive layer is formed inside the second through hole.

20 Claims, 23 Drawing Sheets

WIRING SUBSTRATE INCLUDING CONDUCTIVE CORE SUBSTRATE, AND MANUFACTURING METHOD THEREOF

CROSS-REFERENCE TO RELATED APPLICATIONS

This application claims the benefit of priority from Japanese Patent Application No. 2007-321910 filed on Dec. 13, 2007, which is herein incorporated by reference in its entirety.

BACKGROUND

1. Field

Embodiments of the present invention relate to a wiring substrate and a manufacturing method thereof, more specifically, relates to a wiring substrate including a core substrate which has a conductive property, and a manufacturing method thereof.

2. Description of Related Art

In recent years, a miniaturization, a slimming down, and a higher performance has been demanded of an electronic instrument such as a mobile communication instrument and, along with this, there has been a demand for a miniaturization and a multilayering of an electronic part, such as a semi-conductor element provided in an electronic instrument, and of a wiring substrate (a package substrate) such as a printed circuit board, and for a high density mounting of an electronic part. In order to meet these kinds of demand, as a mounting method of a semi-conductor element wiring substrate, a bare chip mounting technique, such as a flip chip mounting, which directly mounts a semi-conductor element on a wiring substrate, is being employed.

Also, along with a development of a multi-pin semi-conductor element, a multilayer wiring substrate including multiple wiring layers is being employed as the heretofore described wiring substrate. Furthermore, multiple wiring layers are also essential in a tester board for testing a semi-conductor element. As such a multilayer wiring substrate, for example, a built up multilayer wiring substrate including a micro wiring, in which insulating layers and conductive layers are alternately laminated, formed on one main surface or both main surfaces of a core substrate, is being employed.

In this kind of situation, there is a danger that a device having the heretofore described mounting structure, that is, a semi-conductor device including a semi-conductor element bare chip mounted on a built up multilayer wiring substrate, will have a problem with discrepancies in a heat expansion coefficient between various parts configuring the semi-conductor device, leading to a fatigue breakdown, a disconnection or the like. For example, in a case of using a glass epoxy resin substrate as the built up multilayer wiring substrate, a heat expansion coefficient thereof is about 12 to about 20 ppm/° C. As opposed to this, in a case of the semi-conductor element being made of silicon (Si), a heat expansion coefficient thereof is approximately 3.5 ppm/° C. That is, the heat expansion coefficient of the wiring substrate and the heat expansion coefficient of the semi-conductor element differ at least significantly, if not greatly. Consequently, in a case of a temperature change occurring, there is a danger that there will be a problem with a thermal stress, a thermal strain or the like, due to such a heat expansion coefficient difference, leading to a fatigue breakdown, a disconnection or the like.

In order to respond to such a problem, an aspect has been proposed wherein the heat expansion coefficient of the wiring substrate on which the semi-conductor element is to be mounted is reduced, making the difference between the heat expansion coefficient of the semi-conductor element and wiring substrate smaller. Specifically, a wiring substrate has been proposed which, in place of a glass cloth used as the base material (the core substrate) of the glass epoxy resin substrate, employs a resin using a carbon fiber material, of which a heat expansion coefficient is approximately 1.0 to approximately 20 ppm/° C., as the base material (the core substrate).

As one example of the heretofore described wiring substrate, for example, a wiring substrate has been proposed which uses a wiring substrate base material wherein a carbon cloth is impregnated with an epoxy resin. In the example, by providing resin holes in the wiring substrate base material, and loading the epoxy resin into the resin holes, wiring layers are formed on the wiring substrate base material. Then, providing through holes connecting the wiring layers, center lines of the resin holes and center lines of the through holes are caused to approximately coincide.

Also, an electronic part has been proposed wherein, an insulating resin layer being provided on at least one portion of a conductive layer formed on the substrate, the insulating resin layer is formed using an electrodeposition method.

Furthermore, a wiring substrate has been proposed wherein, at least one conductive layer being formed on the substrate, an insulating resin layer is formed, using an electrodeposition method, between the substrate and the conductive layer. In the example, the electrodeposited film includes an organic solvent soluble polyimide and a hydrophilic polymer.

Furthermore, a circuit substrate has been proposed wherein a columnar conductor is disposed in a through hole of a fiber reinforced resin substrate. In the example, a hardened resin layer is interposed between an interior wall surface of the through hole and a peripheral surface of the columnar conductor, and an upper surface of the columnar conductor is covered with a conductive thin layer.

Furthermore, a multilayer printed wiring substrate has been proposed which uses a glass fiber woven fabric as a core material reinforcement material. In the example, a material wherein a glass fiber woven fabric is impregnated with a resin (a resin fiber woven fabric) is used as a reinforcement material of a prepreg in which the core material is laminated and bonded together.

Furthermore, a silicon semi-conductor substrate has been proposed wherein, a metal film being provided on an edge portion of a through hole formed in the silicon semi-conductor substrate, an electrodeposited film is formed on an interior surface of the through hole, including the edge portion.

As a density of a semi-conductor element mounted on a wiring substrate increases, a higher density is also demanded for the wiring substrate. Consequently, a miniaturization and a pitch reduction of wiring in the wiring substrate has become indispensable. For this reason, a pitch reduction of not only the wiring but also of through holes formed in a core substrate is required.

In the current situation, there is a problem in that, in a wiring substrate including a core substrate which has a conductive property, as well as not being possible to reliably isolate the core substrate and a conductive layer formed in a through hole, it is not possible to realize a through hole pitch reduction.

SUMMARY

At least one embodiment of the present invention provides a wiring substrate that includes a core substrate having a first main surface and a mutually opposing second main surface, the second main surface having a conductive property. A first through hole penetrates a core substrate. A first conductive layer extends from the first main surface to the second main surface via the first through hole. An insulating layer is formed on the first conductive layer. A second through hole has the insulating layer as an interior wall. And a second conductive layer is formed inside the second through hole.

It is to be understood that both the foregoing summary description and the following detailed description are explanatory as to some embodiments of the present invention, and not restrictive of the present invention as claimed.

BRIEF DESCRIPTION OF THE DRAWINGS

Embodiments are illustrated by way of example and not limited by the following figures.

DETAILED DESCRIPTION OF EXAMPLES OF EMBODIMENTS

Figure 1A:
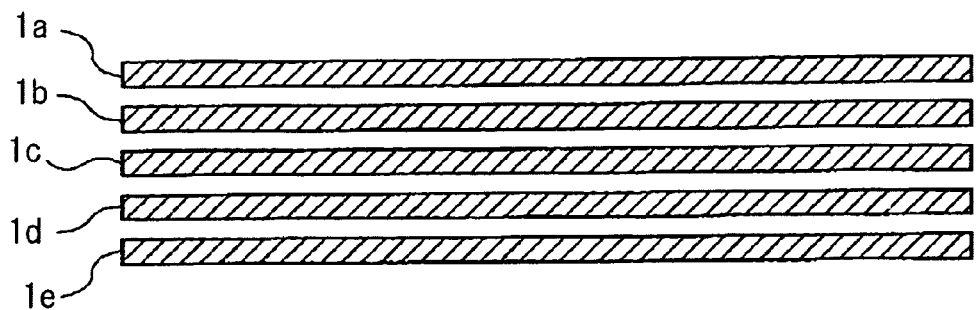
FIGS. 1A to 1V are views for illustrating a method of manufacturing a wiring substrate using carbon fiber as a base material according to an example of an embodiment of the present invention.

In the figures, dimensions and/or proportions may be exaggerated for clarity of illustration. It will also be understood that when an element is referred to as being "connected to" another element, it may be directly connected or indirectly connected, i.e., intervening elements may also be present. Further, it will be understood that when an element is referred to as being "between" two elements, it may be the only element layer between the two elements, or one or more intervening elements may also be present. Like reference numerals refer to like elements throughout.

Among other things, the following description discusses ranges. All ranges including the term "about" should also be understood as describing and including the corresponding ranges without the term "about." For example, the range from about 5% to about 10% includes the range from 5% to 10%.

First, a description will be given, using FIGS. 1A to 1V, of an example of a method of manufacturing a wiring substrate which uses carbon fiber on a base material (a core substrate).

Figure 1B:
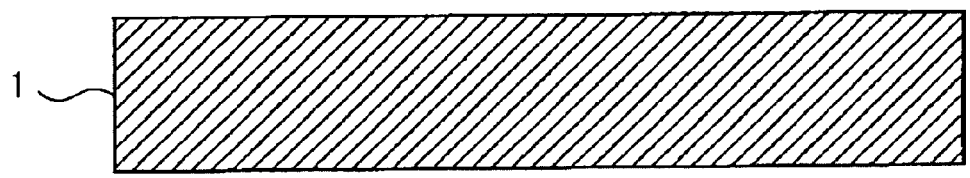
Figure 1C:
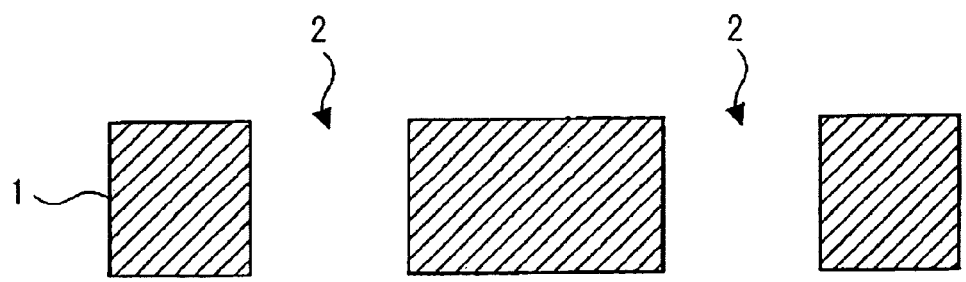
Figure 1D:
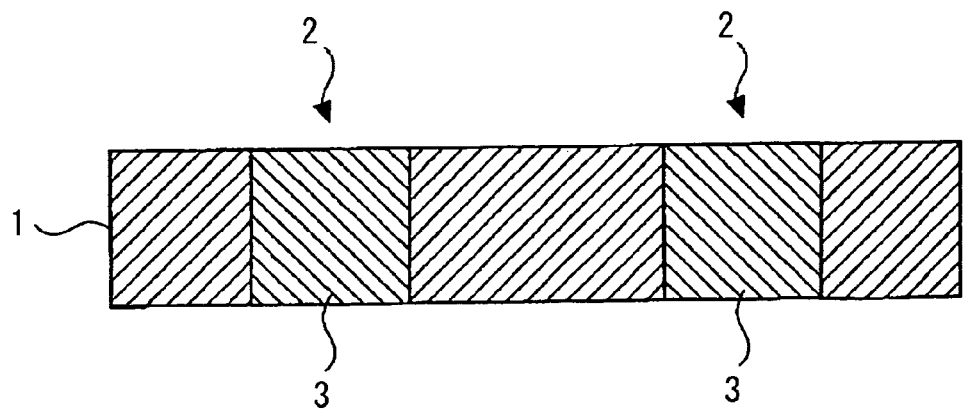
Figure 1E:
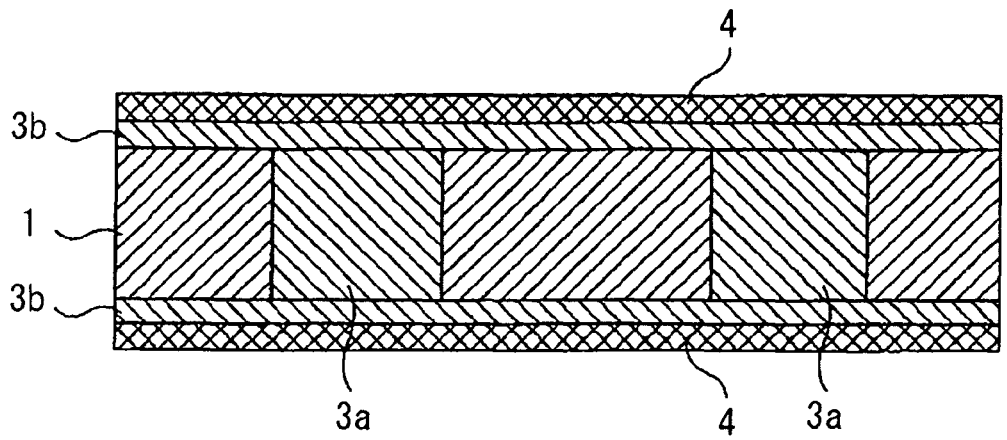
Figure 1F:
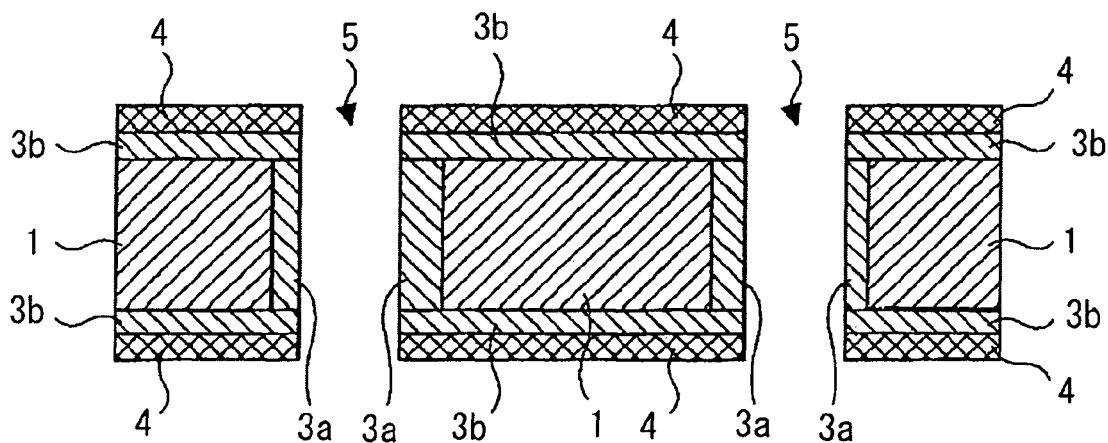
Figure 1G:
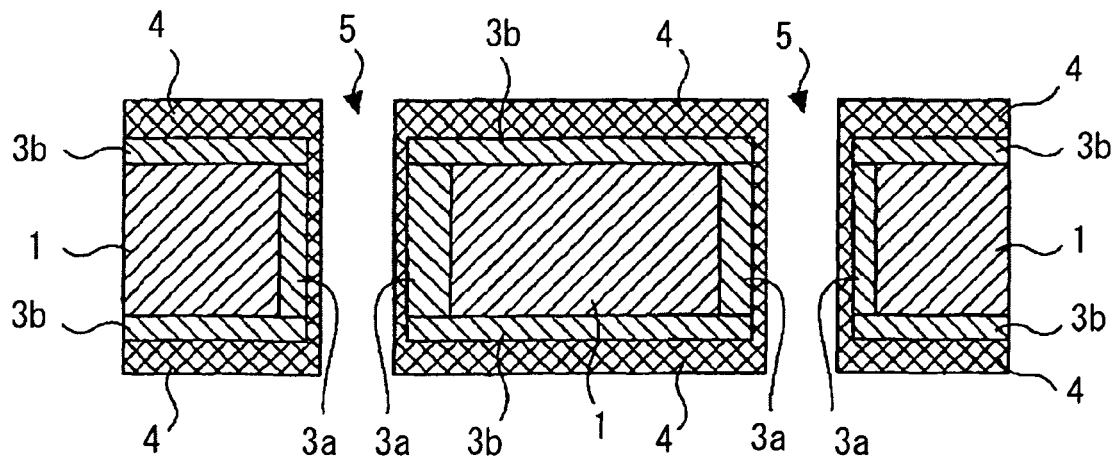
Figure 1H:
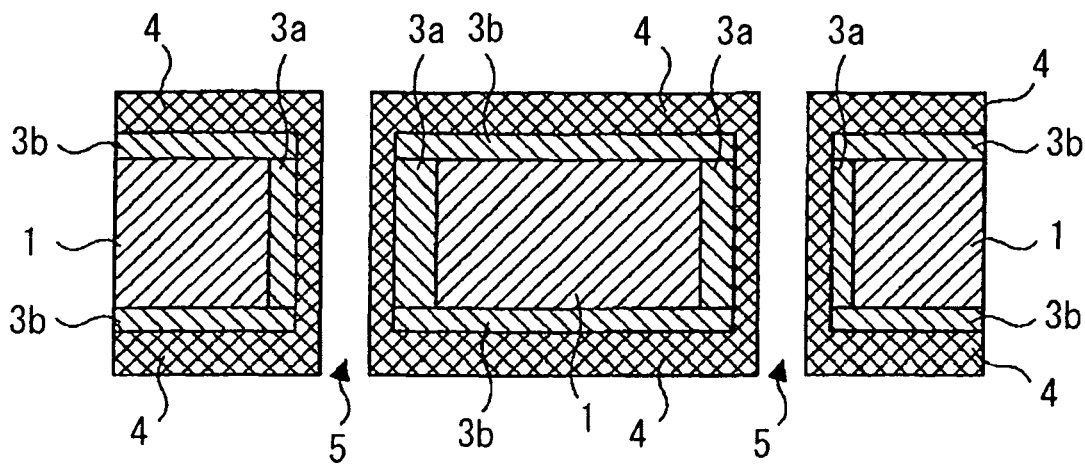

Firstly, a plurality, e.g., five, prepregs 1a to 1e, including carbon fiber impregnated with a resin such as an epoxy resin, are prepared (refer to FIG. 1A). That is, the resin used in the prepregs is a reinforced resin of which a strength is increased by the carbon fiber. Next, the prepregs are pressure bonded, e.g., with a vacuum press, forming a core substrate 1 (refer to FIG. 1B). Next, clearance holes 2 are formed in the core substrate 1 by a drilling process, a laser process or the like (refer to FIG. 1C).

After so doing, an insulating resin 3a, such as the epoxy resin, is loaded into the clearance holes 2, in accordance with a printing method or the like. By carrying out the loading with the insulating resin 3a, the clearance holes 2 are filled with the insulating resin 3a (refer to FIG. 1D). As a result, the core substrate 1 and the clearance holes 2 are isolated by the insulating resin 3a.

Next, an insulating resin 3b is formed on the insulating resin 3a. Next, a foil-shaped layer, e.g., a copper (Cu) layer, 4 is laminated on the insulating resin 3b (refer to FIG. 1E). Next, using a drilling process, a laser processing method or the like, through holes 5, of a diameter smaller than a diameter of the clearance holes 2, are formed in places in the core substrate 1 in which the clearance holes 2 are provided (refer to FIG. 1F). The through holes 5, in the core substrate 1 on which the insulating resin 3b and the copper layer 4 are formed, penetrate from a front surface to a rear surface of the core substrate 1. Also, centers of the through holes 5 approximately coincide with centers of the clearance holes 2. That is, the through holes 5 are provided in positions which are approximately concentric with the clearance holes 2.

After so doing, a corresponding material file, e.g., a copper film, is formed on a surface of the foil-shaped copper layer 4 and interior wall surfaces of the through holes 5 by an electroless plating process. As a result, along with the copper film being laminated on the copper layer 4 formed in FIG. 1E, a thin copper film is also formed on the interior wall surfaces of the through holes 5 (refer to FIG. 1G). Next, a copper plating layer is formed on the surface of the copper layer 4 formed in FIG. 1E by an electrolytic plating process (refer to FIG. 1H).

Figure 1I:
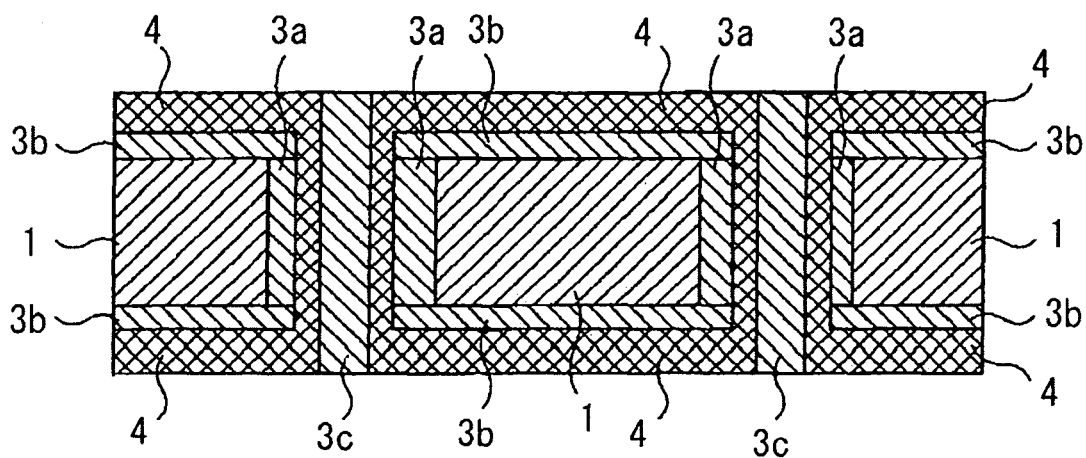
Figure 1J:
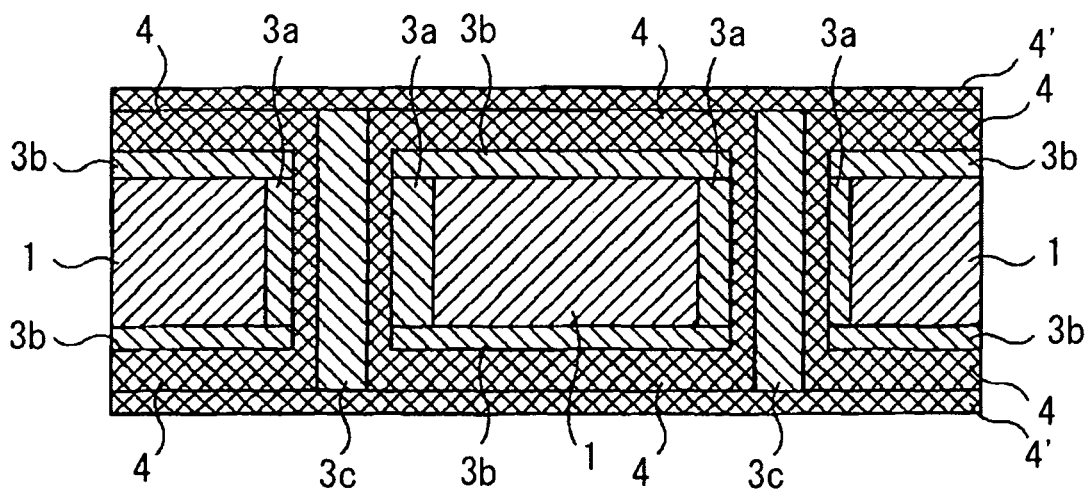

Next, by loading an insulating resin 3c, such as the epoxy resin, into the through holes 5, in accordance with a printing method or the like, the through holes 5 are filled with the insulating resin 3c (refer to FIG. 1I). Furthermore, a copper layer 4' is formed on the copper layer 4 and the insulating resin 3c (refer to FIG. 1J).

Figure 1K:
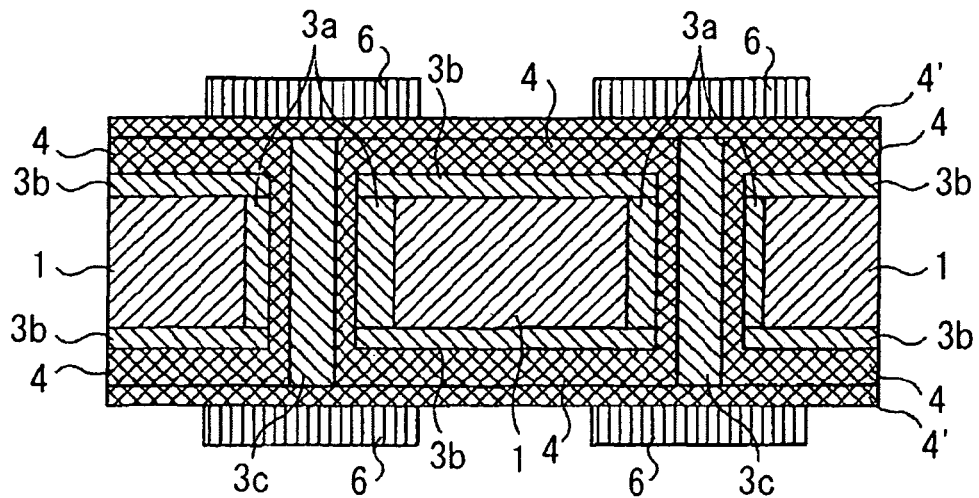
Figure 1L:
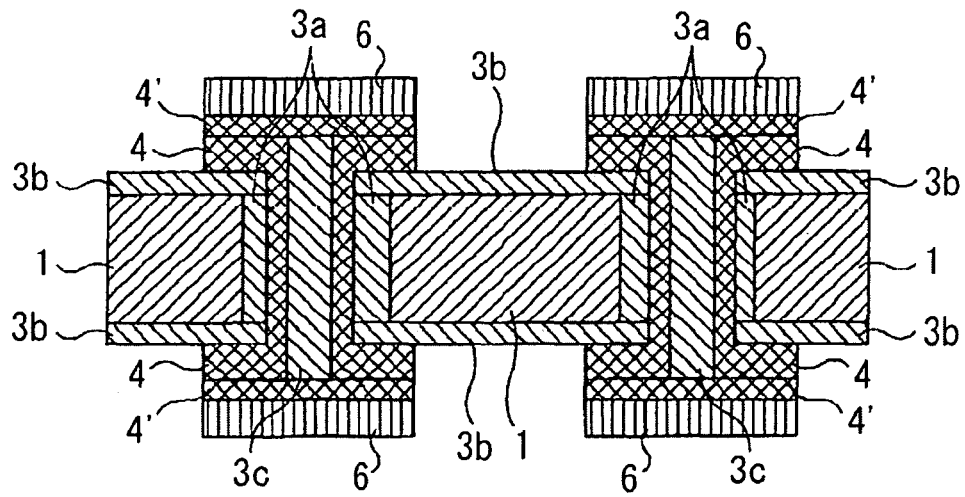
Figure 1M:
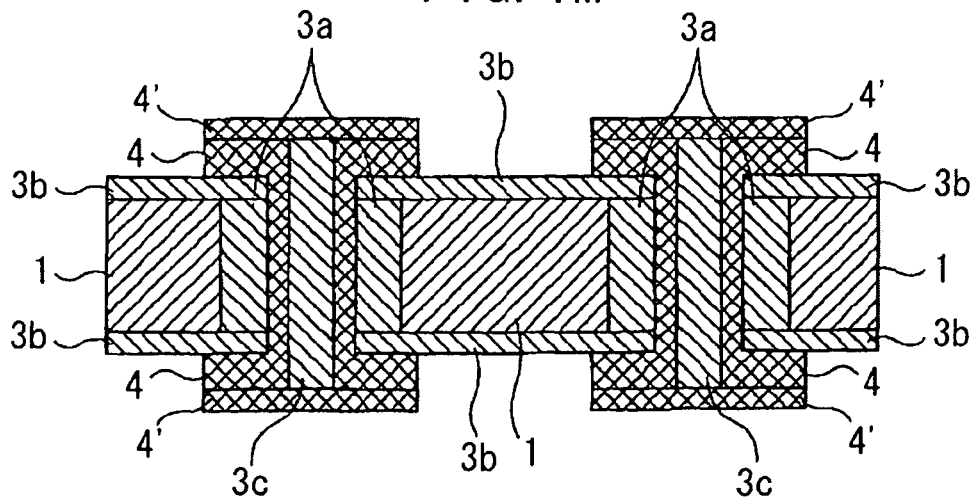

After so doing, a resist pattern 6 is formed on the copper layer 4'. As a method of forming the resist pattern 6, firstly, a dry film (not shown) is formed on the copper layer 4'. The dry film is, e.g., a photosensitive resin made into a film. Next, an exposure and development process is carried out on the dry film formed on the copper layer 4', and a resist pattern (the dry film resist 6) is formed on the copper layer 4' are exposed (refer to FIG. 1K). Next, areas of the copper layer 4 and the copper layer 4' in which the dry film resist 6 is not formed are etched away (refer to FIG. 1L). Subsequently, the dry film resist 6 is stripped off (refer to FIG. 1M).

Figure 1N:
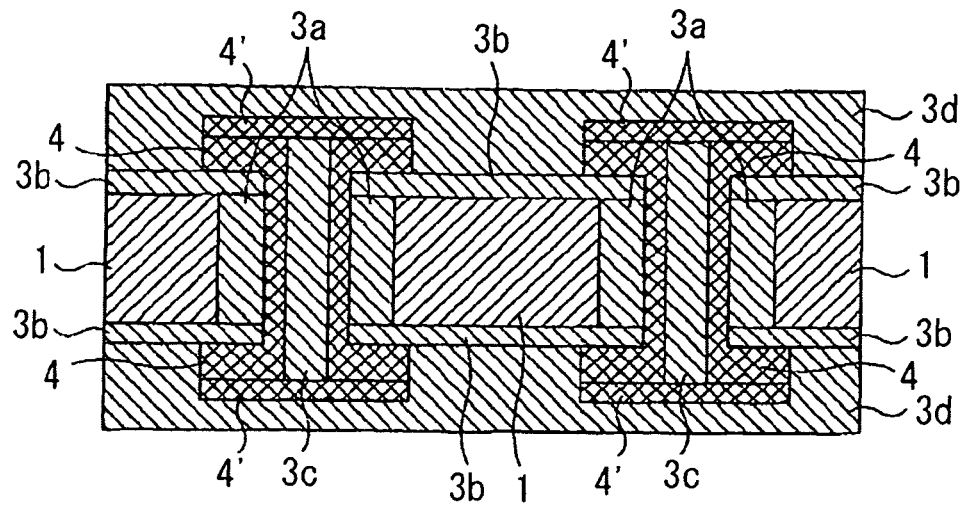
Figure 1O:
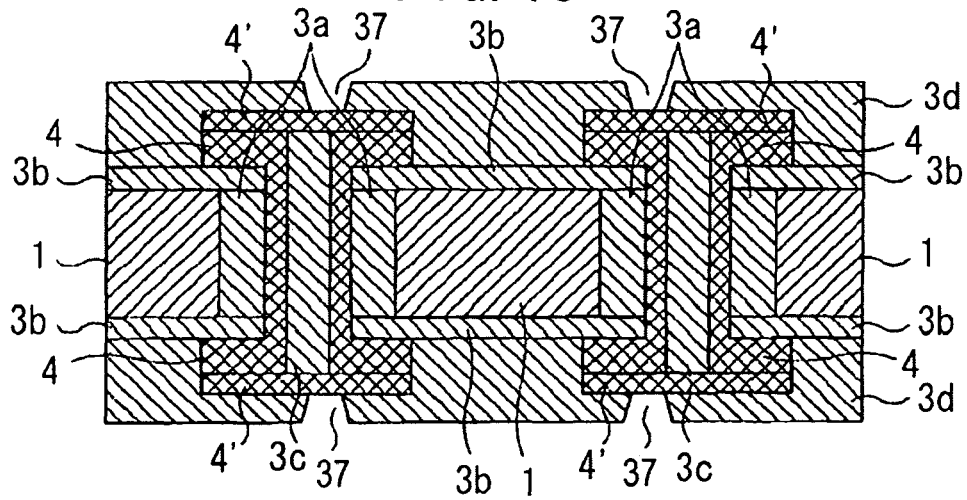
Figure 1P:
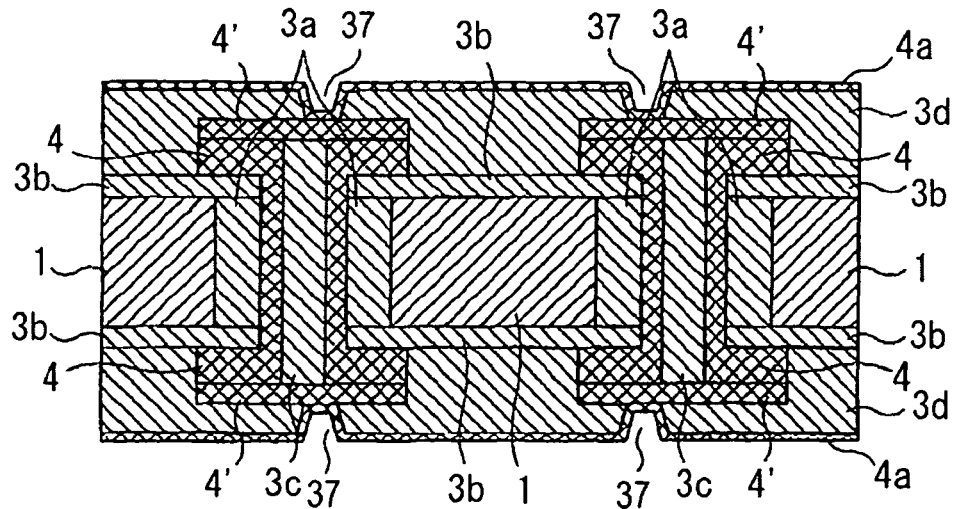

Next, a plurality of wiring layers are formed, by a build up method, on the core substrate 1 on which the above process has been carried out. As a procedure of the build up method, firstly, an insulating resin 3d is formed on the core substrate 1 on which the copper layer 4' is formed. Specifically, the insulating resin 3d is formed on the insulating resin 3b and copper layer 4' exposed by the etching process shown in FIG. 1L (refer to FIG. 1N). Next, e.g., a laser is applied to the insulating resin 3d. By applying the laser, a hole making process (a laser drilling) is carried out on one portion of the insulating resin 3d, and concavities 37 exposing the copper layer 4' are formed (refer to FIG. 1O). Next, by carrying out a plating process, e.g., an electroless plating process, a copper seed layer 4a is formed on the insulating resin 3d and inside the concavities 37 (refer to FIG. 1P).

Figure 1Q:
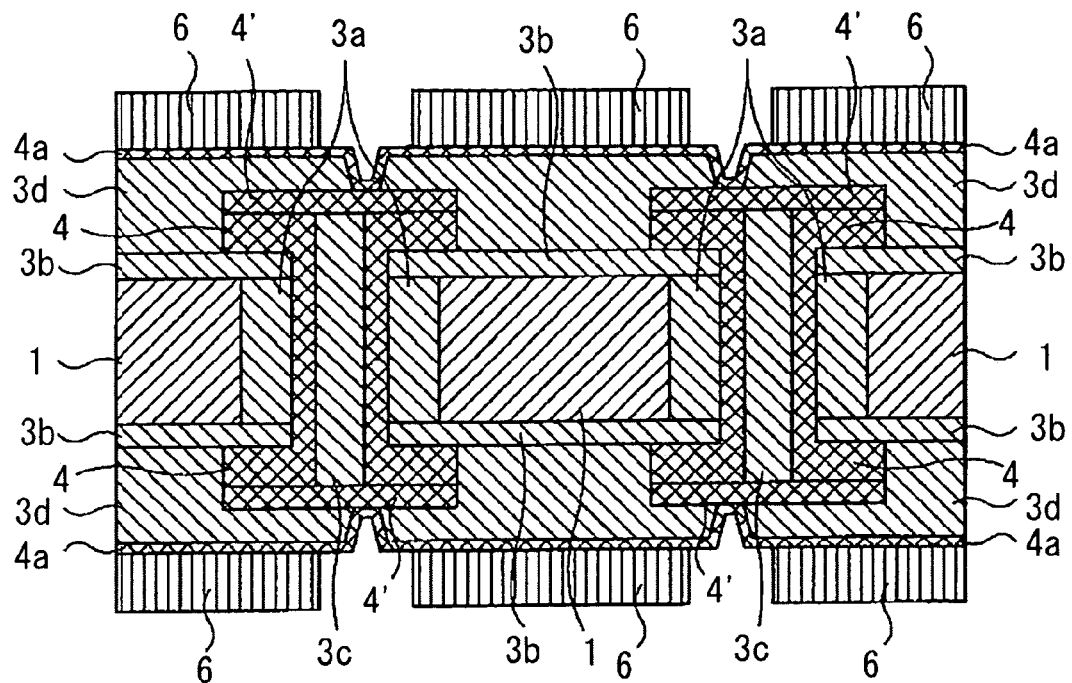
Figure 1R:
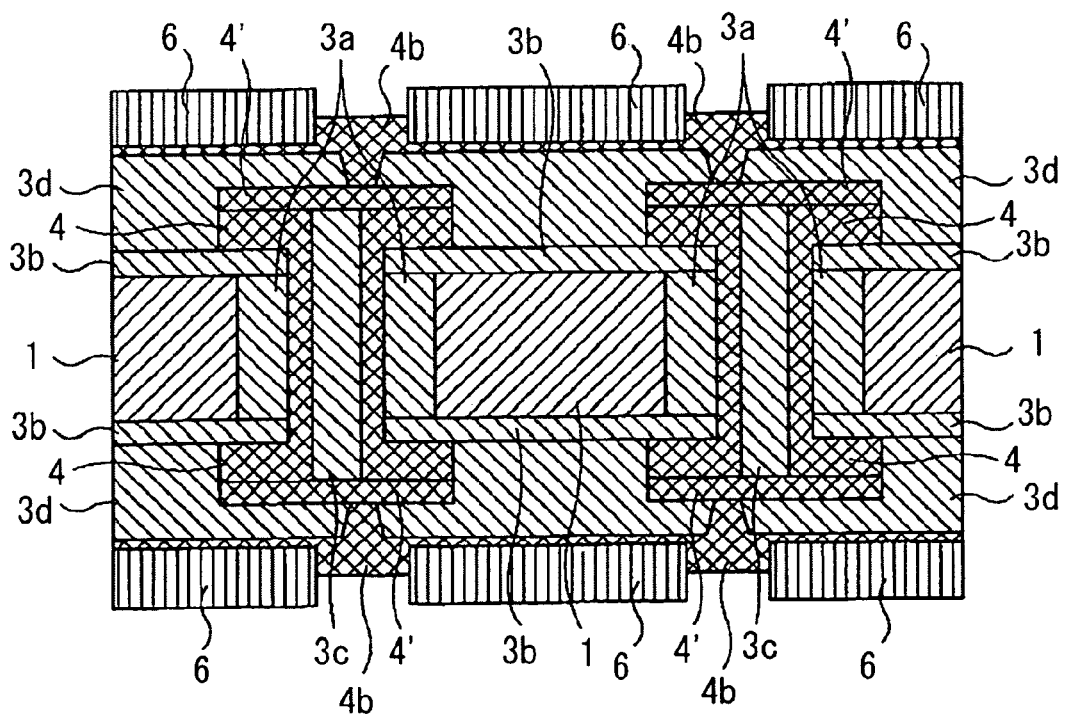

After so doing, the resist pattern 6 is formed in places on the copper seed layer 4a in which the concavities 37 are not formed. As a method of forming the resist pattern 6, firstly, a dry film (not shown) is formed on the copper seed layer 4a. The dry film is a photosensitive resin made into a film. Next, an exposure and development process is carried out on the dry film formed on the copper seed layer 4a, and a resist pattern (the dry film resist 6) is formed on the copper seed layer 4a are exposed (refer to FIG. 1Q). Next, by carrying out an electrolytic plating process, a copper layer 4b which has a desired thickness is formed in places in which the dry film resist 6 is not formed (refer to FIG. 1R).

Figure 1S:
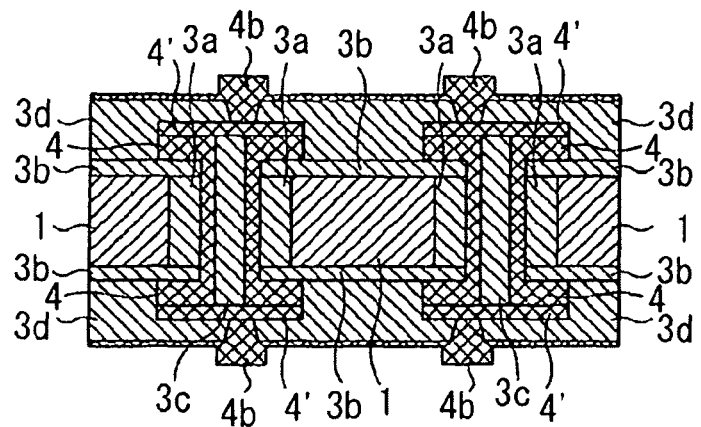
Figure 1T:
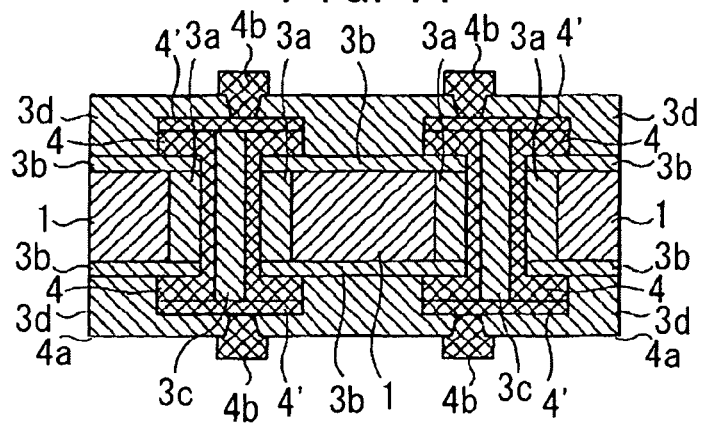

Next, the dry film resist 6 is stripped off (refer to FIG. 1S). Subsequently, the copper seed layer 4a directly under the dry film resist 6 is removed by etching (refer to FIG. 1T).

Figure 1U:
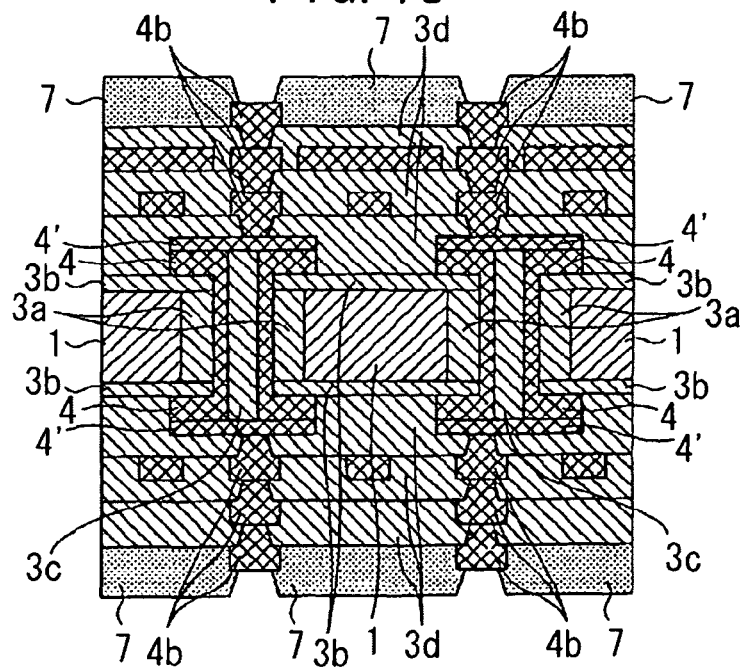
Figure 1V:
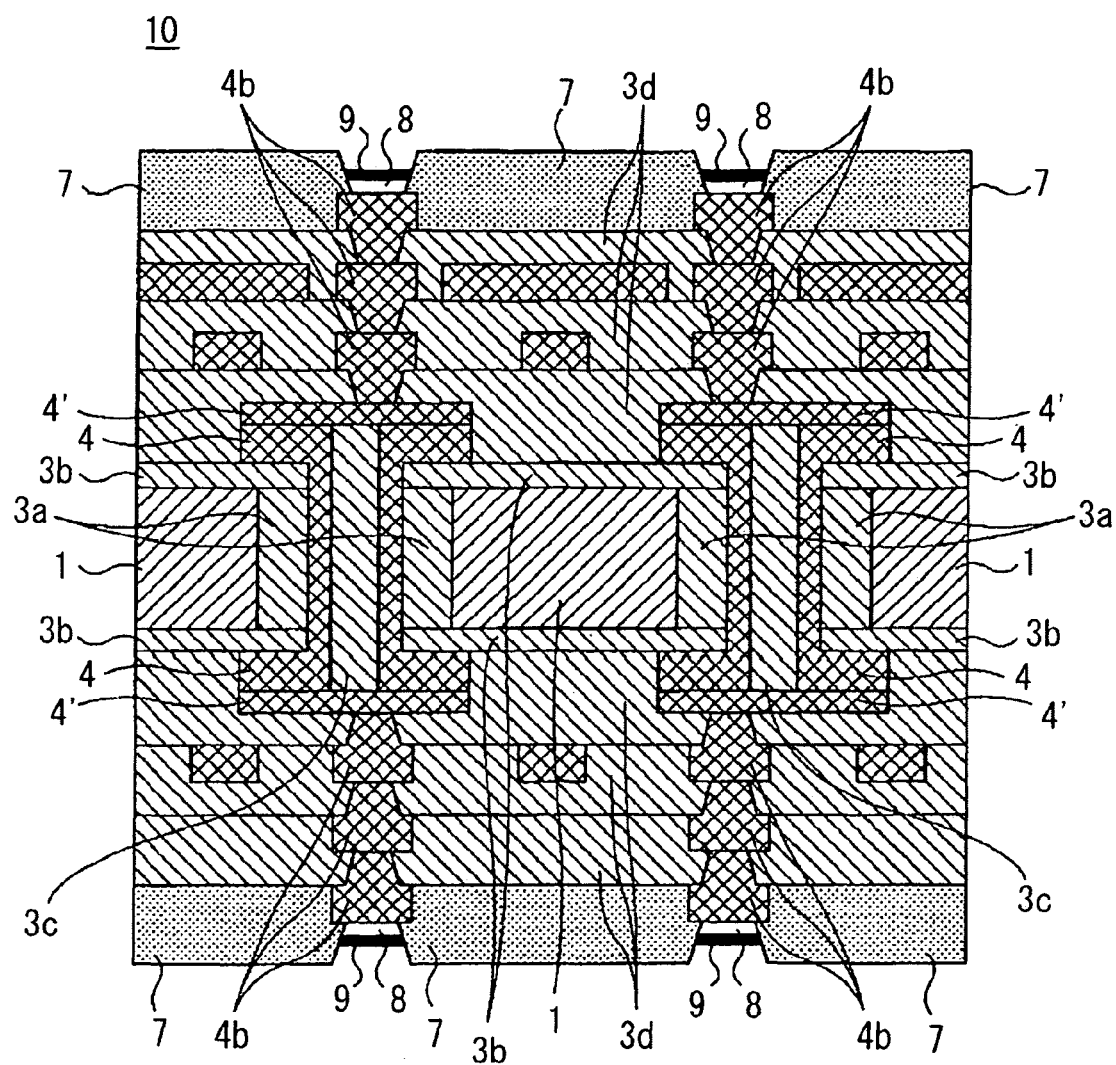

Next, the process shown in FIGS. 1N to 1T is repeated for each of the appropriate layers (twice in the example shown in FIG. 1U). Then, a solder resist layer (an insulating resin film) 7 is formed in places on the insulating resin 3d, which is an uppermost layer, in which the copper layer 4b is not formed. The solder resist layer 7 may be for example, a resin such as an epoxy type, an acrylic type or a polyimide type, a resin which is a compound thereof, or the like.

Lastly, a plating process is carried out on exposed surfaces of the copper layer 4b, which configure electrodes, and, e.g., a nickel (Ni) layer 8 and gold (Au) layer 9 are formed in that order. By so doing, a multilayer wiring substrate 10 is formed. That is, the multilayer wiring substrate 10, employing a resin using carbon fiber as the core substrate 1, is formed.

The heretofore described resin using carbon fiber has an advantage in that it has a low heat expansion rate when compared with a glass cloth used as a base material (a core substrate) of a glass epoxy resin substrate. On the other hand, as the resin using carbon fiber has a conductive property, typically it is desirable to reliably isolate a wiring of the copper layer 4 formed inside the through holes 5, and the like, and the core substrate 1.

In the case of filling the clearance holes 2 with the insulating resin 3, in accordance with the printing method, as shown in FIG. 1D, there is a danger that a loading amount of the insulating resin 3 is insufficient, and that the loading holes 2 would not become completely filled. Also, there is a danger of a void, a crack or the like, occurring in the insulating resin 3 loaded into the clearance holes 2. Consequently, it is desirable to more reliably isolate the core substrate 1 and the copper layer 4.

Also, in the heretofore described wiring substrate 10, firstly, an insulation process is carried out by loading the insulating resin 3 into the clearance holes 2, as shown in FIGS. 1C to 1H. Next, the through holes 5 are formed in the insulating resin 3, and the copper layer 4, which is a conductive layer, is formed on the interior walls of the through holes 5. Consequently, in the wiring substrate 10, the clearance holes 2 having a shape which is sufficiently larger than the through holes 5, and an interval between adjacent through holes 5 becomes larger. Consequently, it is desirable to make the interval between the adjacent through holes 5 of a smaller pitch.

Therein, hereafter, a more desirable specific example will be shown.

Figure 2:
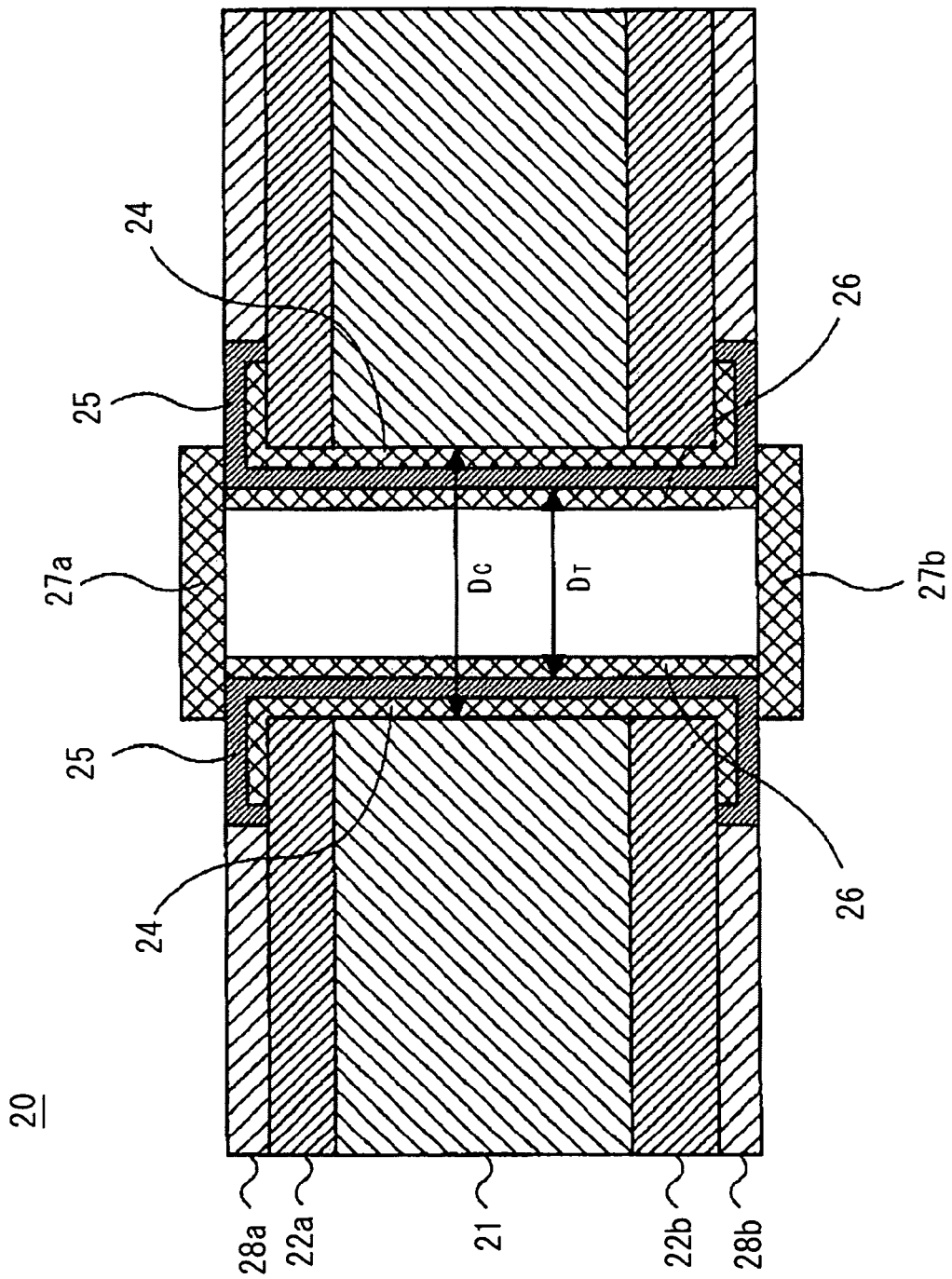
FIG. 2 is a sectional view showing a structure of a wiring substrate according to an example of an embodiment of the present invention.

FIG. 2 shows a basic structure of a wiring substrate.

As shown in FIG. 2, a wiring substrate 20 has a core substrate 21, and a first insulating layer 22a and second insulating layer 22b, which sandwich the core substrate 21. Also, the wiring substrate 20 has a clearance hole of which a diameter is Dc, a first conductive layer 24, a third insulating layer 25, and a second conductive layer 26. Furthermore, the wiring substrate 20 has a first electrode 27a and a second electrode 27b, and fourth insulating layers 28a and 28b.

The plate-shaped core substrate 21 is formed by laminating and pressure bonding a plurality of prepregs. The prepregs include, e.g., a carbon fiber material with a conductive property impregnated with an epoxy type resin composition. The core substrate 21 is formed by, for example, laminating and pressure bonding, e.g., five prepregs with a thickness of, for example, approximately 0.2 mm.

As the carbon fiber material, it is possible to use, for example, a carbon fiber cloth, a carbon fiber mesh, a carbon fiber fiberless cloth, or the like. The carbon fiber cloth, being woven of a carbon fiber yarn wherein carbon fibers are bundled together, is oriented in such a way as to flatten out in a surface extension direction. Also, an inorganic filler such as an alumina filler, an aluminum nitride filler, or a silica filler is blended with the epoxy type resin composition which envelops the carbon fiber material, achieving a heat expansion rate reduction. As a material included in the core substrate 21, apart from the heretofore described carbon fiber, it is also acceptable to use a carbon nanotube, Invar® brand of 36 alloy (Fe-36% NI), or a 42 alloy (Fe-42% Ni). The carbon nanotube, the 36 alloy (Fe-36% NI), and the 42 alloy (Fe-42% Ni) all have a conductive property.

The first insulating layer 22a is formed on a front surface (a first main surface) of the core substrate 21, while the second insulating layer 22b is formed on a rear surface (a second main surface) of the core substrate 21. The first insulating layer 22a and the second insulating layer 22b (insulating portions) are made of, for example, an epoxy type resin.

Also, the clearance hole (a first through hole), which penetrates the core substrate 21, the first insulating layer 22a and the second insulating layer 22b, are formed in the wiring substrate 20. The clearance hole has the diameter Dc. A number of clearance holes formed changes in accordance with factors such as a wiring layout but, specifically, it is acceptable to form, for example, approximately 1,000 clearance holes. Also, it is acceptable to set the diameter Dc of the clearance holes at, for example, 0.5 mm.

The first conductive layer 24, made of copper, is formed on an approximate whole of an interior wall surface of the clearance hole, and on the first insulating layer 22a and the second insulating layer 22b on a periphery of the clearance hole. The first conductive layer 24 is integrally formed by, for example, a plating process. As the material configuring the core substrate 21 includes carbon fiber, as heretofore described, microscopic concavities and convexities are formed on the surfaces (the first main surface and the second main surface) of the core substrate 21, and the interior wall surface of the clearance hole. In order to reduce, if not eliminate, the concavities and convexities, and smoothen the interior wall surface, the first conductive layer 24 is formed on the approximate whole of the interior wall surface of the clearance hole.

The third insulating layer 25 (an insulating layer), including an electrodeposited resin film, is formed on the first conductive layer 24. The third insulating layer 25 is also formed on extremities of the first conductive layer 24 on the first insulating layer 22a and the second insulating layer 22b. The third insulating layer 25 is formed in such a way as to cover the extremities of the first conductive layer 24.

The third insulating layer 25, made of, for example, an epoxy type resin, a polyimide type resin or the like, is formed by an electrodeposition method. As the third insulating layer 25 is formed by an electrodeposition method, it is possible to make a film thickness of the third insulating layer 25 small and uniform. Consequently, it is possible to set the film thickness to, for example, approximately 15 mm to approximately 25 mm. As a result, it is possible to make the diameter of the clearance hole formed in the core substrate 21 smaller.

Also, a through hole (a second through hole) is formed, approximately concentrically with the clearance hole, in the third insulating layer 25. The through hole (the second through hole) penetrates the core substrate 21, and has a diameter DT which is smaller than the diameter Dc of the clearance hole. It is possible to set the diameter DT of the through hole at, for example, about 0.2 mm. In this way, it being possible to make the diameter Dc of the clearance hole a size approximately equivalent to the diameter DT of the through hole, it is possible to realize a reduction of a through hole pitch.

It is also acceptable that, apart from the electrodeposition method, the third insulating layer 25 is formed using an evaporation method. In the event of using the evaporation method, it is possible to use, e.g., a polyparaxylylene type resin as the material configuring the third insulating layer 25. By using the evaporation method, it is possible to form the third insulating layer 25 more uniformly than with the electrodeposition method.

The second conductive layer 26 made of, for example, copper, is formed by a plating process on a surface of the third insulating layer 25 inside the through hole. It is acceptable that an insulating resin or a conductive layer is provided in a portion inward of the second conductive layer 26 inside the through hole, and it is also acceptable that it is a cavity.

Then, the first electrode 27a and the second electrode 27b made of, for example, copper, are formed on a peripheral portion of an opening portion of the through hole in the third insulating layer 25, and on extremities of the second conductive layer 26. The first electrode 27a and the second electrode 27b are electrically connected to the second conductive layer 26. Therefore, the first electrode 27a and the second electrode 27b are electrically connected to each other via the second conductive layer 26.

In the above way, the first conductive layer 24 is integrally formed on the interior wall of the clearance hole, and on the periphery of the clearance hole on the first insulating layer 22a and the second insulating layer 22b. Also, the third insulating layer 25 is formed on such a first conductive layer 24. For this reason, it is possible to reliably isolate the core substrate 21 and the second conductive layer 26, which have a conductive property. Furthermore, as heretofore described, it being possible to make the diameter Dc of the clearance hole a size approximately equivalent to the diameter DT of the through hole, it is possible to realize a reduction of the through hole pitch.

As the third insulating layer 25 is provided between the first conductive layer 24 and the first electrode 27a and second electrode 27b, a short circuit between the first conductive layer 24 and the first electrode 27a, and the chances of a short circuit between the first conductive layer 24 and the second electrode 27b, are reduced, if not prevented.

Also, the fourth insulating layers 28a and 28b, made of an epoxy type resin or the like, are formed on exterior sides of the third insulating layer 25, on the first insulating layer 22a and second insulating layer 22b. Due to the forming of the fourth insulating layers 28a and 28b, upper surfaces of the first insulating layer 22a and second insulating layer 22b, and upper surfaces of the fourth insulating layers 28a and 28b, are in the same plane (that is, a continuous plane).

In this way, according to the example shown in FIG. 2, the first conductive layer 24 is integrally formed on the interior wall of the clearance hole, and on the periphery of the clearance hole on the first insulating layer 22a and the second insulating layer 22b. Then, the third insulating layer 25 is formed on the first conductive layer 24. For this reason, it is possible to reliably isolate the core substrate 21 and the second conductive layer 26, which have a conductive property.

In particular, as the third insulating layer 25 is formed on the first conductive layer 24 by the electrodeposition method, it is possible to make the film thickness of the third insulating layer 25 small and uniform. Therefore, it is possible to make the diameter of the clearance hole provided in the core substrate 21 smaller.

Also, as it is possible to make the diameter Dc of the clearance hole a size approximately equivalent to the diameter DT of the through hole formed penetrating approximately concentric with the clearance hole, it being possible to realize a reduction of the through hole pitch, it is possible to provide a wiring substrate 20 of a high density and a high reliability.

In the heretofore described example, on one surface (an upper surface) and the other surface (a lower surface) of the core substrate 21, the extremities of the first conductive layer 24 and the extremities of the third insulating layer 25 are positioned on the first insulating layer 22a and on the second insulating layer 22b. Then, the extremities of the first conductive layer 24 and the extremities of the third insulating layer 25 are positioned on the core substrate across the first insulating layer 22a and the second insulating layer 22b. It is also acceptable that the extremities of the first conductive layer 24 and the third insulating layer 25 are positioned on the one surface or the other surface of the core substrate 21, without being mediated by the first insulating layer 22a and the second insulating layer 22b.

Meanwhile, in the example shown in FIG. 2, the first electrode 27a and the second electrode 27b made of, for example, copper, are formed on the peripheral portion of the opening portion of the through hole in the third insulating layer 25, and on the extremities of the second conductive layer 26.

Figure 3:
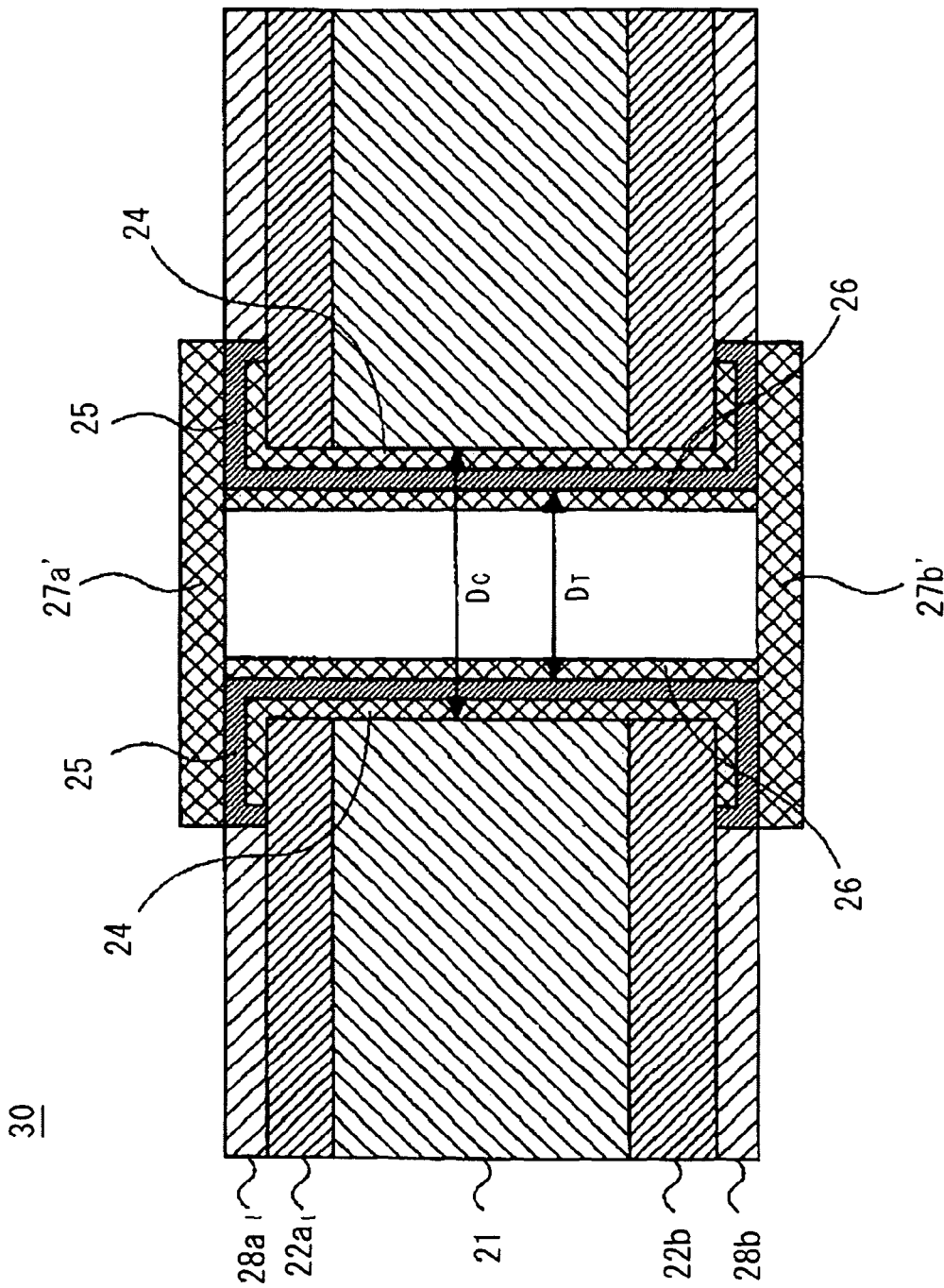
FIG. 3 is a sectional view showing another structure of a wiring substrate according to an example of an embodiment of the present invention.

Next, a description will be given of FIG. 3. In FIG. 3, identical reference numerals and letters are given to places which are the same as the places shown in FIG. 2, and a detailed description thereof is omitted.

In a wiring substrate 30 shown in FIG. 3, a first electrode 27a' and a second electrode 27b' are formed on a whole of portions, of the third insulating layer 25, positioned on the first insulating layer 22a and the second insulating layer 22b. Also, the first electrode 27a' and second electrode 27b' are also formed on the extremities of the second conductive layer 26. That is, a width of the first electrode 27a' and second electrode 27b' is set larger than a width of the first electrode 27a and second electrode 27b shown in FIG. 2. Then, the first electrode 27a' and second electrode 27b' are connected to the second conductive layer 26.

Also, in the example shown in FIG. 3, the first conductive layer 24 and the third insulating layer 25 have a cross-section of an approximate horizontal U shape, while the second conductive layer 26 has an approximately rectilinear cross-section. However, the embodiment is not limited to such an example.

Figure 4:
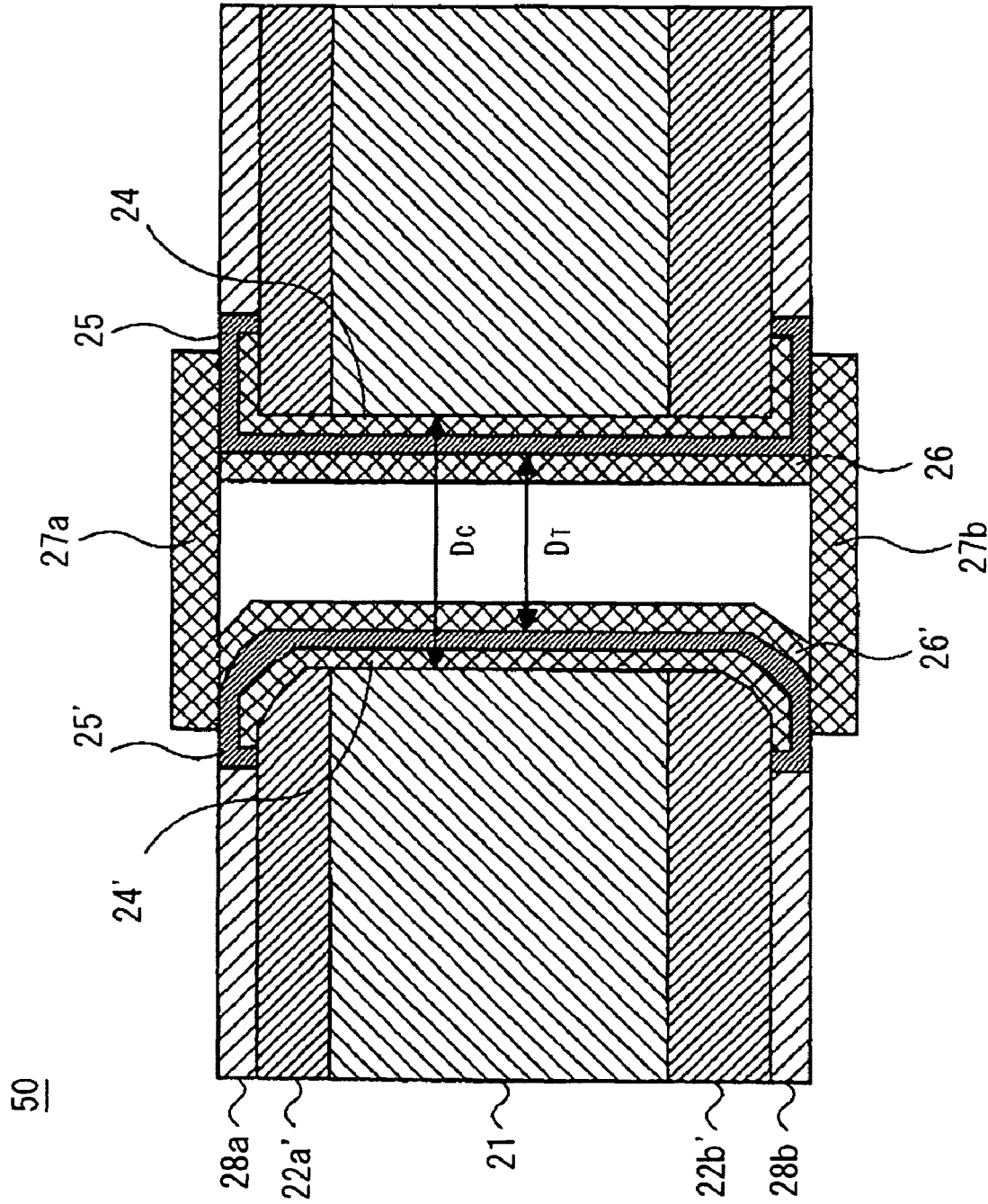
FIG. 4 is a sectional view showing another structure of a wiring substrate according to an example of an embodiment of the present invention.

Next, a description will be given of FIG. 4. In FIG. 4, identical reference numerals and letters are given to places which are the same as the places shown in FIG. 2, and a detailed description thereof is omitted.

In a wiring substrate 50 shown in FIG. 4, a diameter of a clearance hole in a first insulating layer 22a' and a second insulating layer 22b' is set in such a way as to become larger than the diameter Dc inside the core substrate 21 the farther it moves away from the core substrate 21. Also, a diameter of a through hole in the first insulating layer 22a' and the second insulating layer 22b' is set in such a way as to become larger than the diameter DT inside the core substrate 21 the farther it moves away from the core substrate 21.

Then, a first conductive layer 24' is formed along a tapered shape provided in such a clearance hole. Also, a third insulating layer 25' has a shape which follows the shape of the first conductive layer 24'. The third insulating layer 25' is formed on the first conductive layer 24'. Also, a second conductive layer 26' has a shape which follows the shape of the third insulating layer 25', and is formed on the third insulating layer 25'.

That is, as shown in FIG. 4, places in the first conductive layer 24', the third insulating layer 25', and the second conductive layer 26' in which the first insulating layer 22a' and the second insulating layer 22b' are provided are formed in an approximately curved shape. Furthermore, among thicknesses of the first conductive layer 24', the third insulating layer 25', and the second conductive layer 26', thicknesses in places in which the first insulating layer 22a' and the second insulating layer 22b' are provided are set at values greater than thicknesses of the first conductive layer 24', the third insulating layer 25', and the second conductive layer 26' in other places (that is, the clearance hole and the through hole).

In the wiring substrate 20 shown in FIG. 2, the third insulating layer 25 is provided between the first conductive layer 24 and the first electrode 27a and second electrode 27b. For this reason, the chances for short circuits between the first conductive layer 24 and the first electrode 27a and second electrode 27b are reduced, if not prevented. Furthermore, by providing the structure of FIG. 4, it is possible to reliably reduce the chances of, if not prevent, a short circuit between the first conductive layer 24' and the second conductive layer 26'. That is, it being possible to more reliably reduce the chances of, if not prevent, a short circuit between the first conductive layer 24' and the second conductive layer 26' in a vicinity of openings of the clearance hole (the clearance hole in the first insulating layer 22a' and the second insulating layer 22b'), it is possible to achieve an increase in an insulating reliability.

Next, a description will be given of a wiring substrate manufacturing method. Hereafter, a description will be given, referring to FIGS. 5A to 5V, giving a multilayer wiring substrate as an example.

Figure 5A:
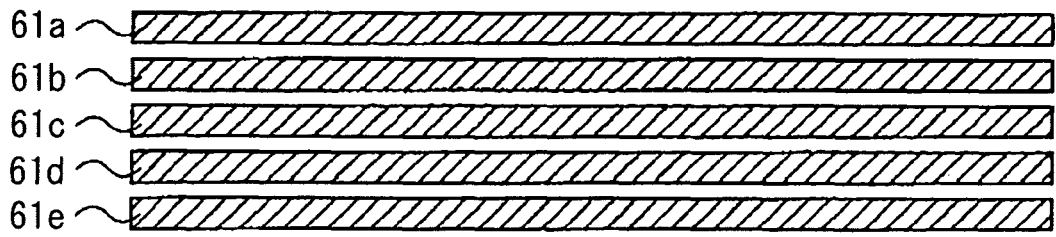
FIGS. 5A to 5V are views for illustrating another method of manufacturing a wiring substrate according to an example of an embodiment of the present invention.

Firstly, a plurality of, e.g., five, prepregs 61a to 61e of a reinforced resin with a thickness of, for example, approximately 0.2 mm, are prepared (refer to FIG. 5A). The prepregs 61a to 61e include, e.g., carbon fiber impregnated with a resin material such as an epoxy resin. Then, the prepregs are pressure bonded, e.g., with a vacuum press, forming a core substrate 61 (refer to FIG. 5B).

As the carbon fiber material, it is possible to use, for example, a carbon fiber cloth, a carbon fiber mesh, a carbon fiber fiberless cloth, or the like. The carbon fiber cloth, being woven of a carbon fiber yarn wherein carbon fibers are bundled together, is oriented in such a way as to flatten out in a surface extension direction. Also, an inorganic filler such as an alumina filler, an aluminum nitride filler, or a silica filler is blended with the epoxy type resin composition which envelops the carbon fiber material, achieving a heat expansion rate reduction. As a material included in the core substrate 61, apart from the heretofore described carbon fiber, it is also acceptable to use a carbon nanotube, 36 alloy (Fe-36% NI), or a 42 alloy (Fe-42% Ni). The carbon nanotube, the 36 alloy (Fe-36% NI), and the 42 alloy (Fe-42% Ni) all have a conductive property.

Next, clearance holes (first through holes) 62 which, as well as having a uniform diameter Dc in all places, penetrate the core substrate 61, are formed in the core substrate 61. The clearance holes 62 are formed by a drilling process, a laser process or the like (refer to FIG. 5C). A number of clearance holes 62 formed changes in accordance with factors such as a wiring layout but, specifically, it is acceptable to form, for example, approximately 1,000 clearance holes 62. Also, it is possible to set the diameter Dc of the clearance holes at, for example, 0.5 mm.

Figure 5B:
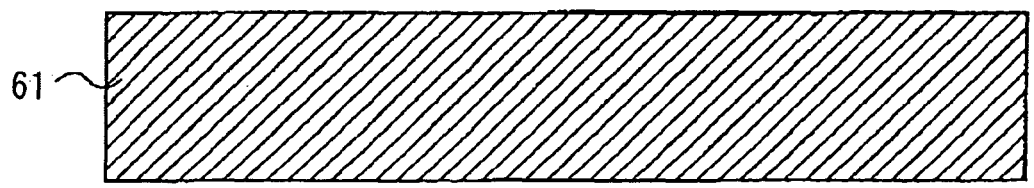
Figure 5C:
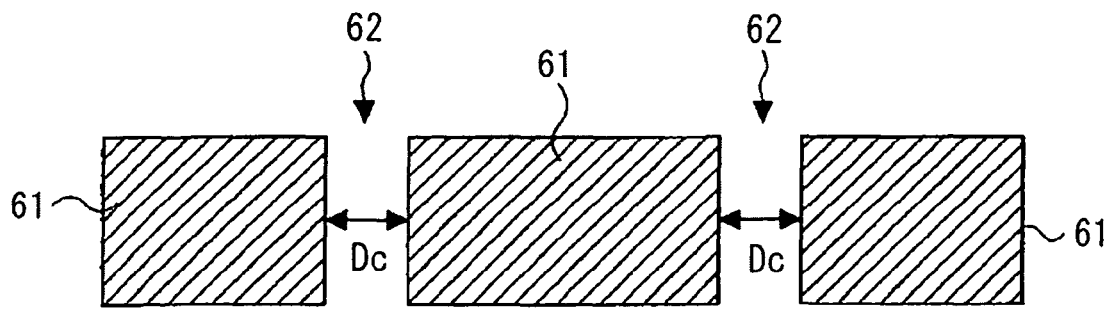
Figure 5D:
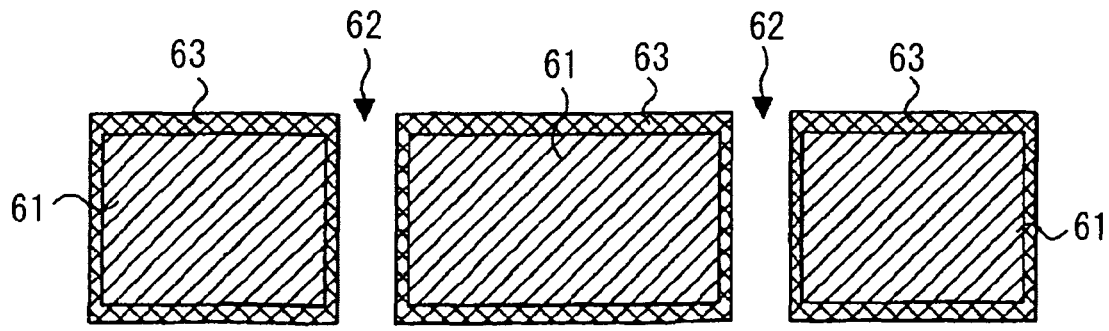

After so doing, a first conductive layer 63 made of copper is formed, by an electroless plating process, on a whole surface of the core substrate 61 in which the clearance holes 62 are formed (refer to FIG. 5D). As the material configuring the core substrate 61 includes carbon fiber, as heretofore described, there is a danger of microscopic concavities and convexities being formed on surfaces of the core substrate 61, and on interior wall surfaces of the clearance holes 62. For this reason, in order to reliably provide the first conductive layer 63, made of copper, by the electroless plating process, the first conductive layer 63 is formed on an approximate whole of the interior wall surfaces of the clearance holes 62.

Figure 5E:
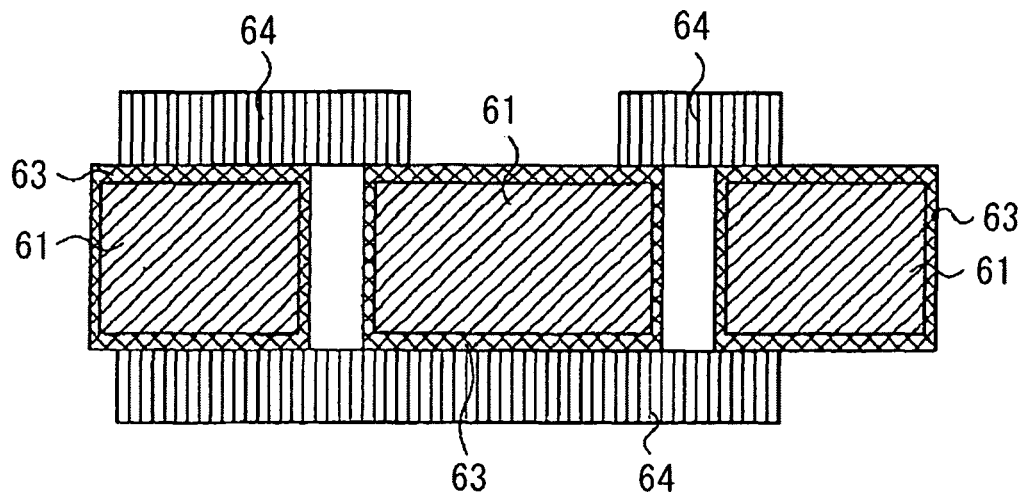
Figure 5F:
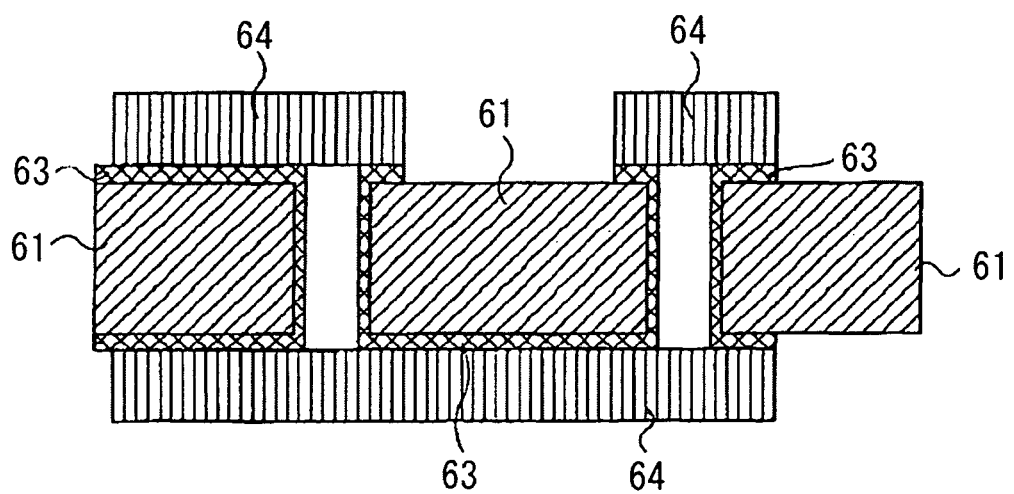
Figure 5G:
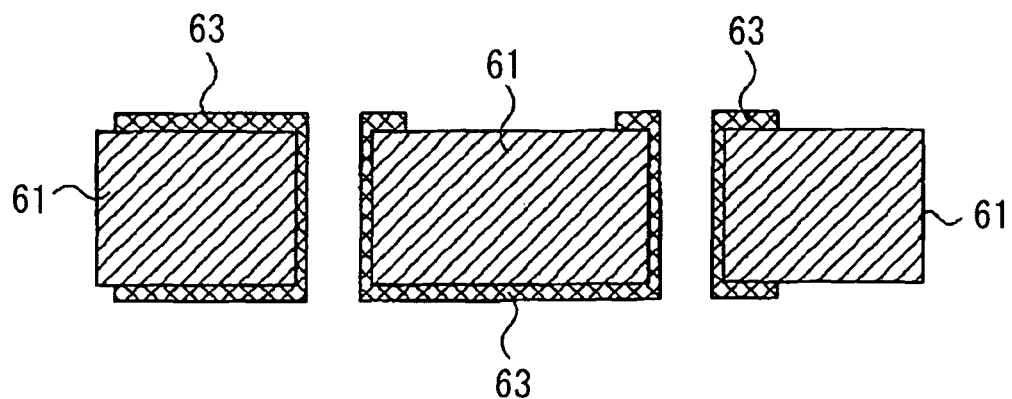

Next, in order to eliminate places on the first conductive layer 63 which are unnecessary, a dry film resist 64, which is an etching resist wherein a photosensitive resin is made into a film, is laminated on the front surface and rear surface of the core substrate 61 on which the first conductive layer 63 is formed. Next, a resist pattern is formed, by an exposure and development, wherein the unnecessary places are exposed (refer to FIG. 5E). Next, areas of the conductive layer 63 in which the dry film resist 64 is not formed are etched away (refer to FIG. 5F), after which, the dry film resist 64 is stripped off (refer to FIG. 5G).

Figure 5H:
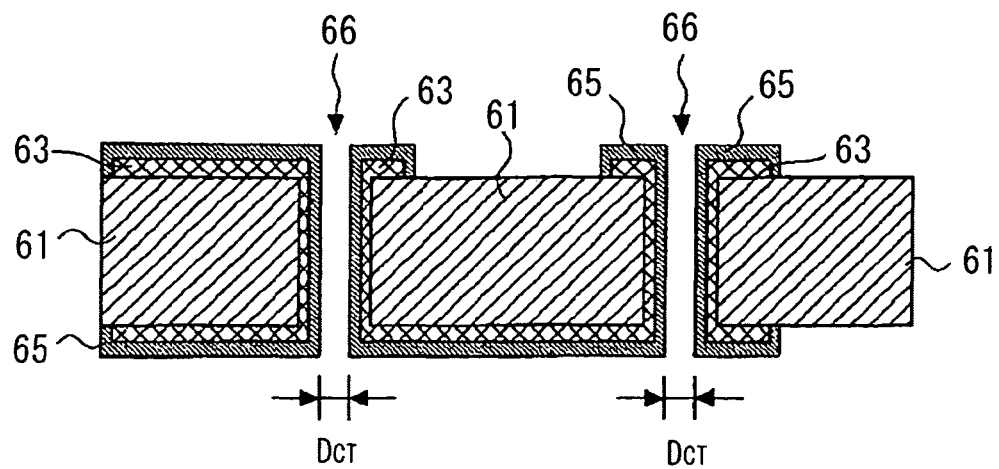

After so doing, the third insulating layer 25 shown in FIG. 2, and an electrodeposited resin film 65 (an insulating layer), are formed on the interior wall surfaces of the clearance holes 62, and on the first conductive layer 63 selectively formed on the front surface and rear surface of the core substrate 61. Furthermore, the third insulating layer 25 shown in FIG. 2, and the electrodeposited resin film 65 (the insulating layer), are also formed on extremities of the first conductive layer 63 on the core substrate 61 (refer to FIG. 5H). The electrodeposited resin film 65, being made of, for example, a polyimide type resin or the like, is formed by an electrodeposition method.

More specifically, in the core substrate 61, power is supplied from the first conductive layer 63. Exposed portions of the first conductive layer 63 are connected to a direct current power source, and the core substrate 61 is immersed in a polyimide electrodeposition solution. An energizing is carried out, e.g., by a constant voltage process, in the condition in which the core substrate 61 is immersed in the polyimide electrodeposition solution, causing a polyimide resin to be deposited on the first conductive layer 63. Subsequently, a drying process is carried out in stages. As a result, the electrodeposited resin film 65, of which a film thickness is uniform, and the film thickness is approximately 15 mm to 25 mm, is formed on the first conductive layer 63.

The film thickness of the electrodeposited resin film 65 being small in this way, through holes (second through holes) 66, having the electrodeposited resin film 65 as walls, are formed inside the clearance holes 62 (FIGS. 5C and 5D) at the same time as the formation of the electrodeposited resin film 65. Specifically, the through holes 66 of a diameter DT, which is smaller than the diameter Dc of the clearance holes 62, are formed approximately concentric with the clearance holes 62. It is possible to set the diameter DT of the through holes 66 at, for example, 0.2 mm. In this way, it being possible to make the diameter Dc of the clearance holes 62 a size approximately equivalent to the diameter DT of the through holes 66, it is possible to realize a reduction of a through hole 66 pitch.

It is also possible to use an epoxy type resin as the material configuring the electrodeposited resin film 65. Also, it is also acceptable that, apart from the electrodeposition method, the electrodeposited resin film 65 is formed using an evaporation method. In the event of forming the electrodeposited resin film 65 using the evaporation method, e.g., it is possible to use a polyparaxylylene type resin as the material configuring the electrodeposited resin film 65. By using the evaporation method, it is possible to form the resin film more evenly than with the electrodeposition method.

Figure 5I:
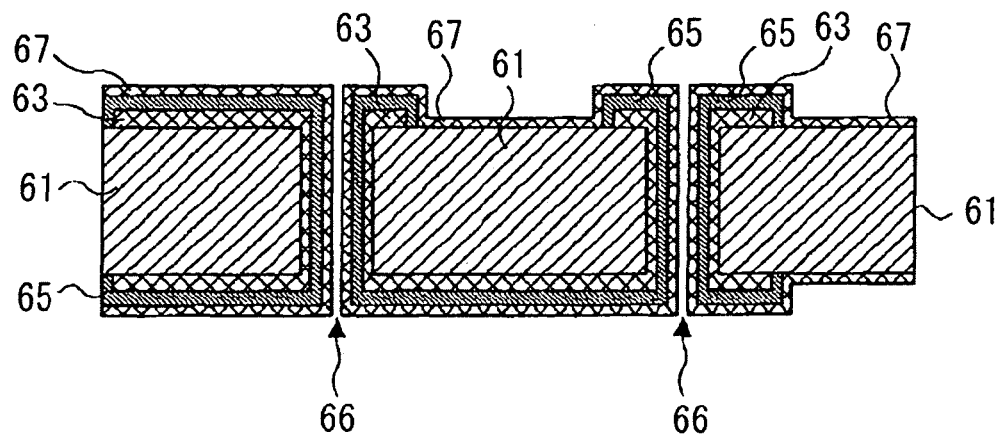

Next, a copper seed layer 67 is formed, e.g., by an electroless plating process, over a whole surface of the electrodeposited resin film 65 (refer to FIG. 5I).

Figure 5J:
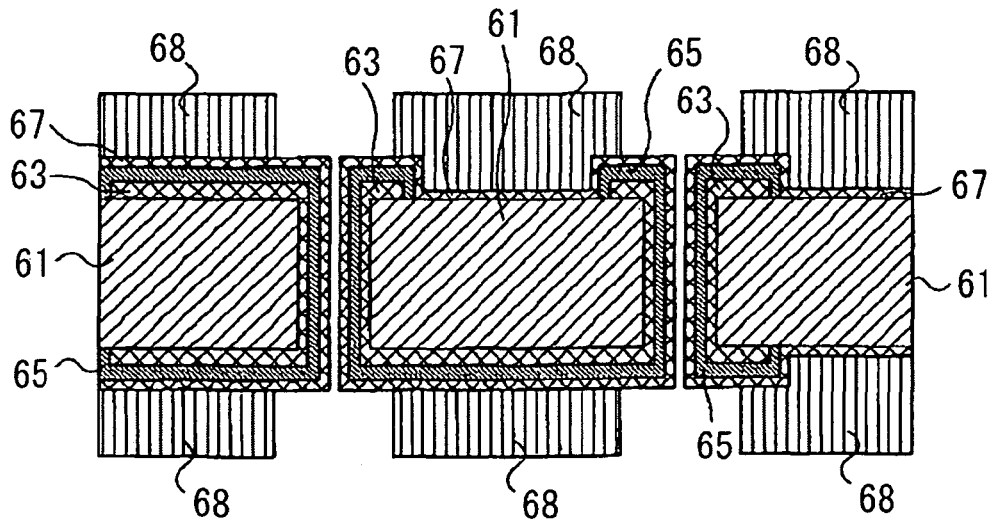

After so doing, a dry film, which is an etching resist wherein a photosensitive resin is made into a film, is laminated on places on the copper (Cu) seed layer 67 other than places in which the through holes 66 are formed, and vicinities thereof. Next, a patterned resist pattern (a dry film resist 68) is formed by means of an exposure and development (refer to FIG. 5J).

Figure 5K:
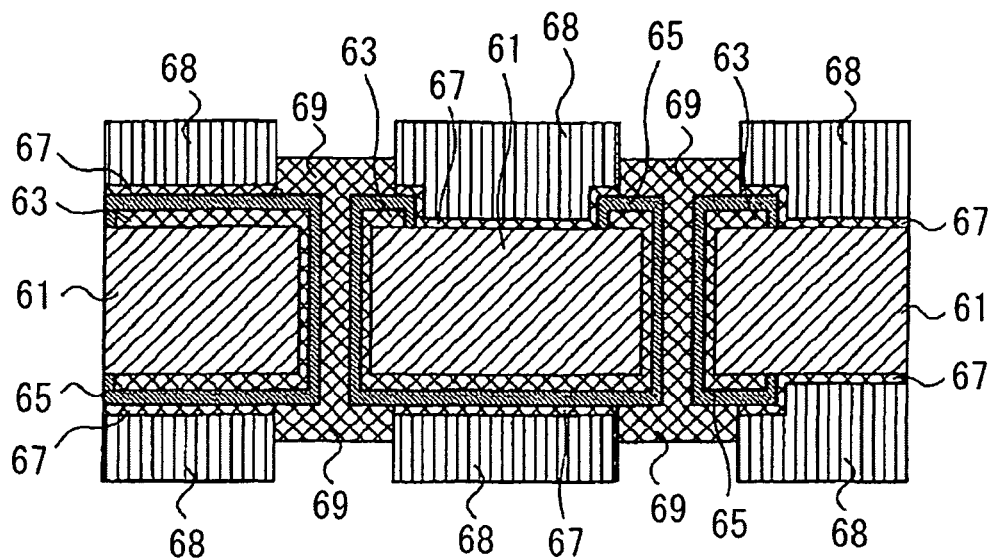

Next, a copper layer 69, is formed by an electrolytic plating process in places in which the dry film resist 68 is not formed, filling the through holes 66 (refer to FIG. 5K). As the electrodeposited resin film 65 configuring peripheral portions of the through holes 66 is formed in the process shown in FIG. 5H, the copper layer filling the through holes 66, and the core substrate 61, are thoroughly insulated.

Figure 5L:
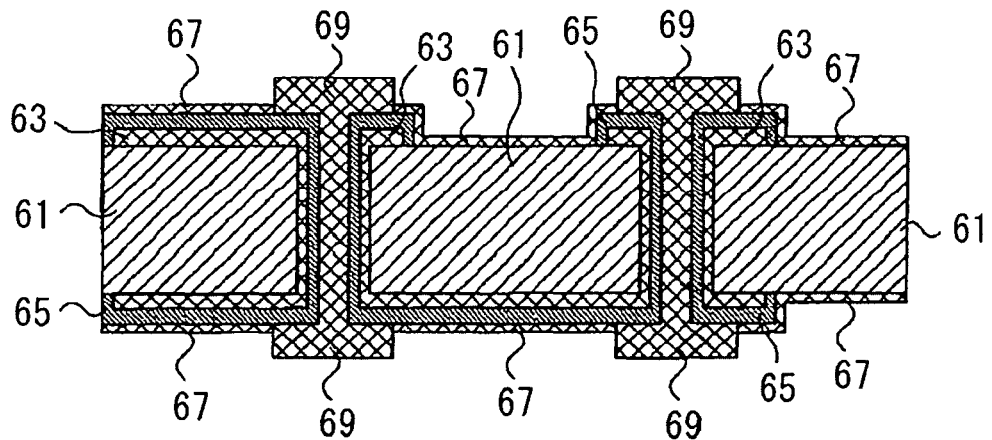
Figure 5M:
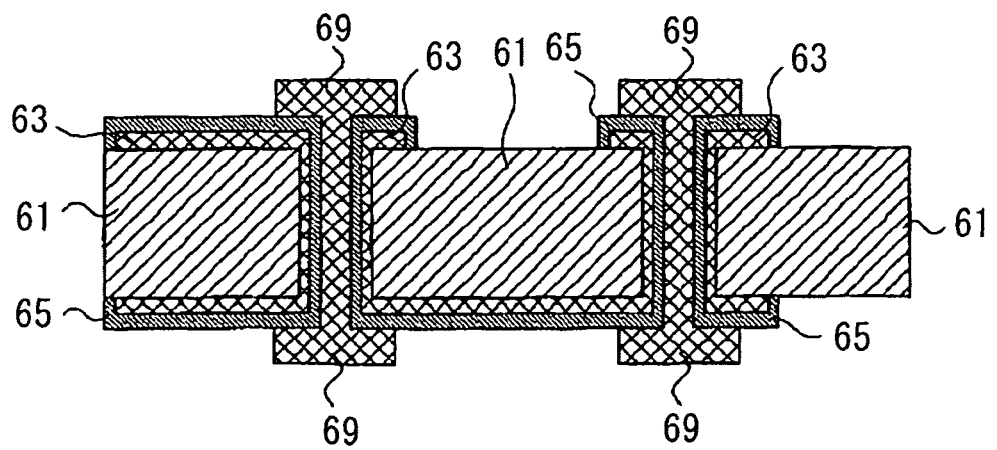

Next, the dry film resist 68 is stripped off (refer to FIG. 5L). Next, the copper seed layer 67 formed directly under the dry film resist 68 is removed by etching (refer to FIG. 5M).

Figure 5N:
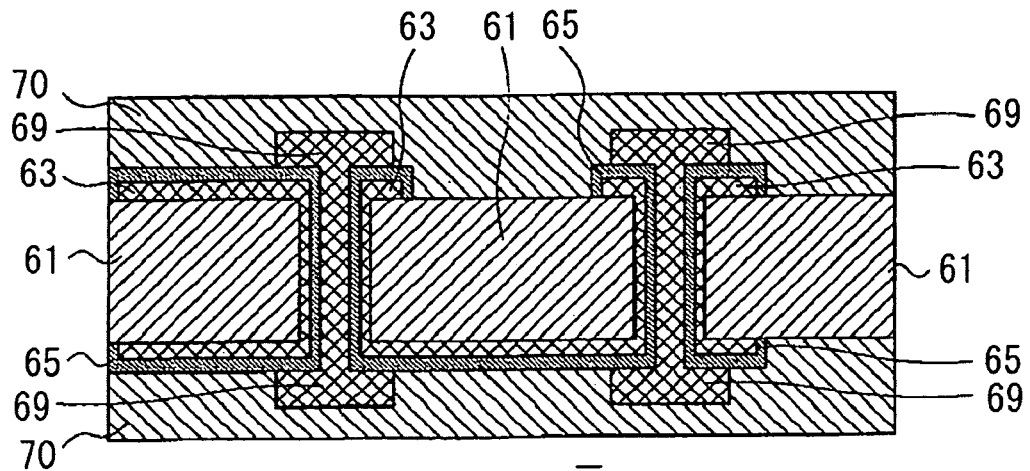
Figure 5O:
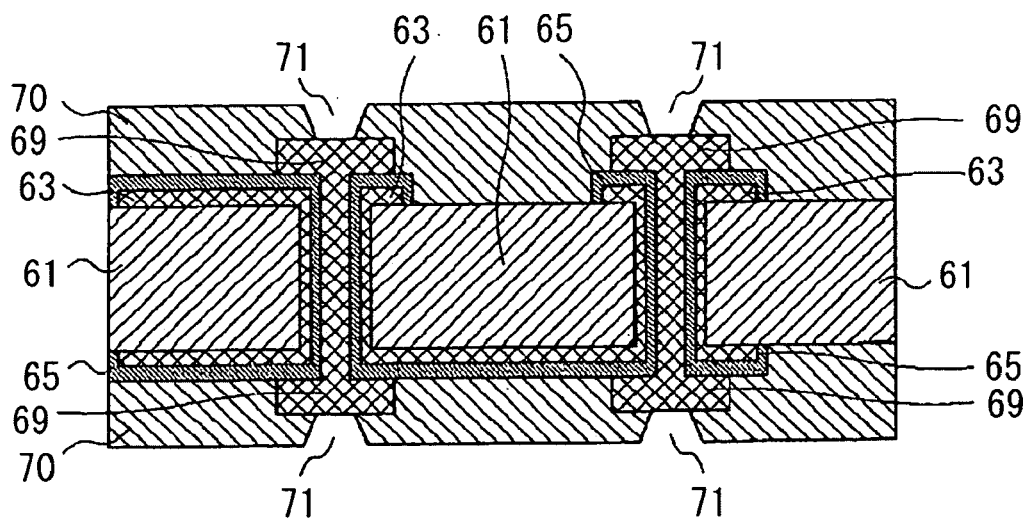
Figure 5P:
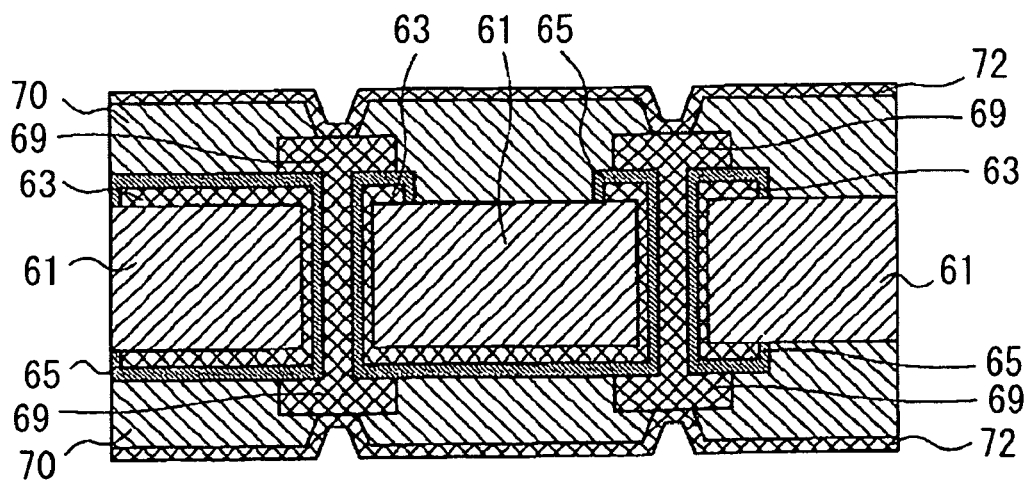

Next, a build up process is implemented. That is, an insulating resin 70, corresponding to the fourth insulating layer 28 shown in FIG. 2, is formed on an electrodeposited resin film 65b exposed by the etching process shown in FIG. 5L, on the copper layer 69, and on the core substrate 61 (refer to FIG. 5N). Next, by applying a laser to the insulating resin 70, and carrying out a laser drilling, concavities 71 partially exposing the copper layer 69 are formed (refer to FIG. 5O). Then, by an electroless plating process, a copper seed layer 72 is formed on the insulating resin 70 and inside the concavities 71 (refer to FIG. 5P).

Figure 5Q:
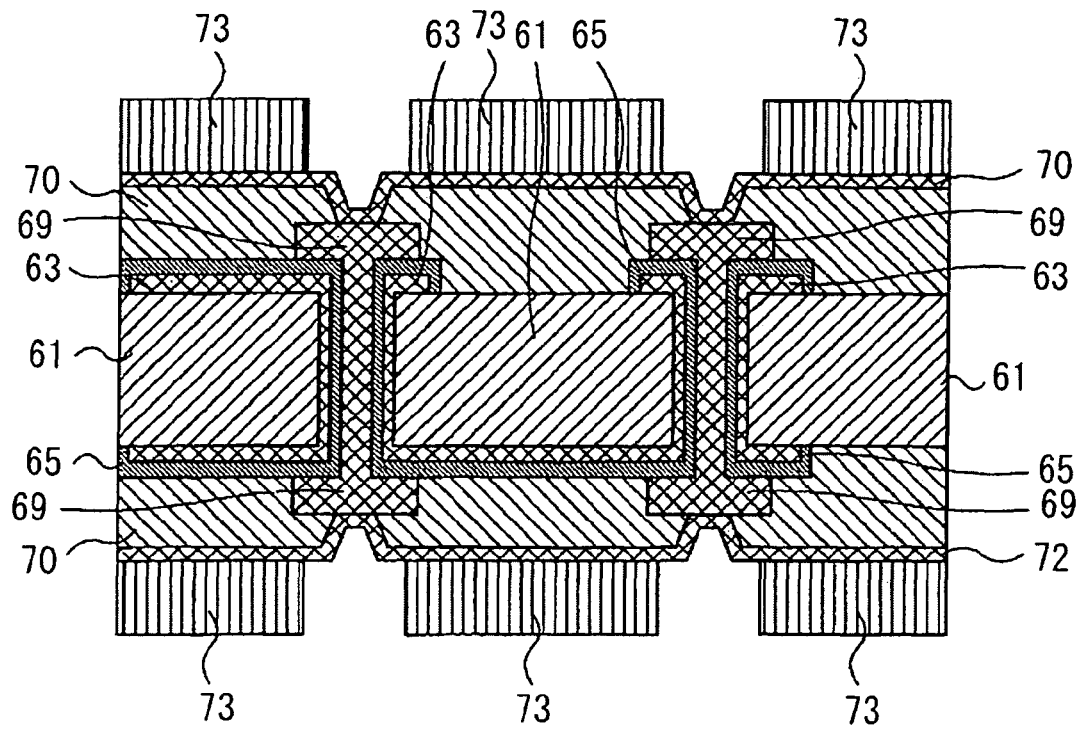
Figure 5R:
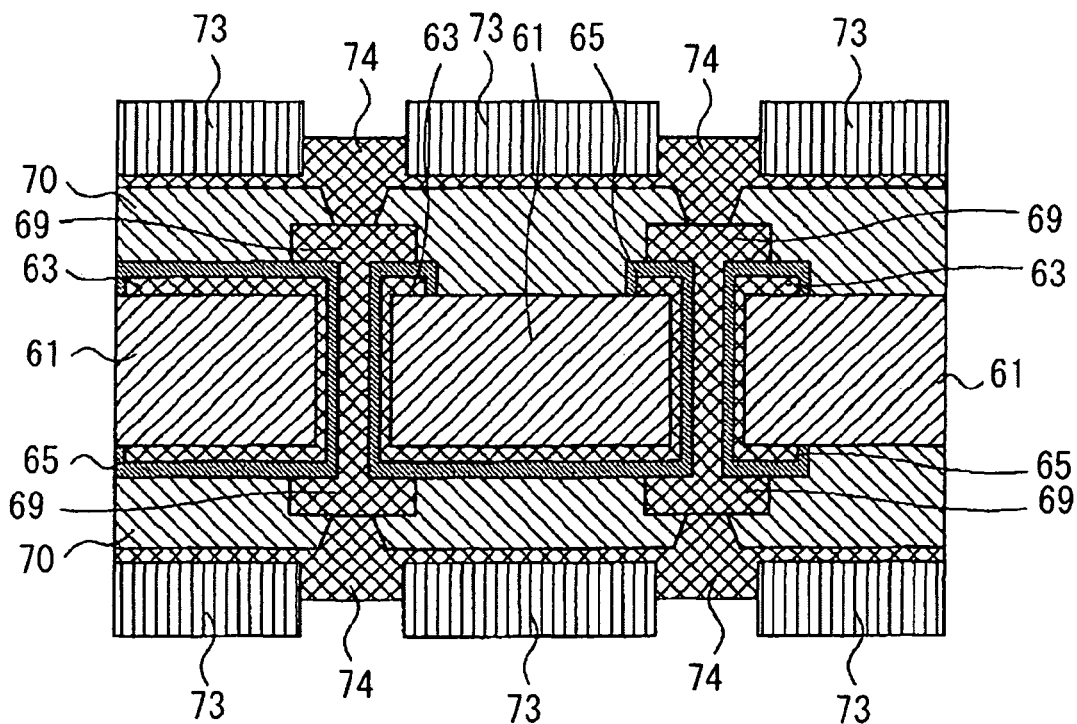

After so doing, a dry film (not shown) is laminated on the copper seed layer 72 in places in which the concavities 71 are not formed. The dry film is a photosensitive resin made into a film. Next, by an exposure and development, a resist pattern (a dry film resist 73) is formed wherein predetermined places on the seed layer 72 are exposed (refer to FIG. 5Q). Next, a copper layer 74 is formed, e.g., by an electrolytic plating process, in places in which the dry film resist 73 is not formed (refer to FIG. 5R).

Figure 5S:
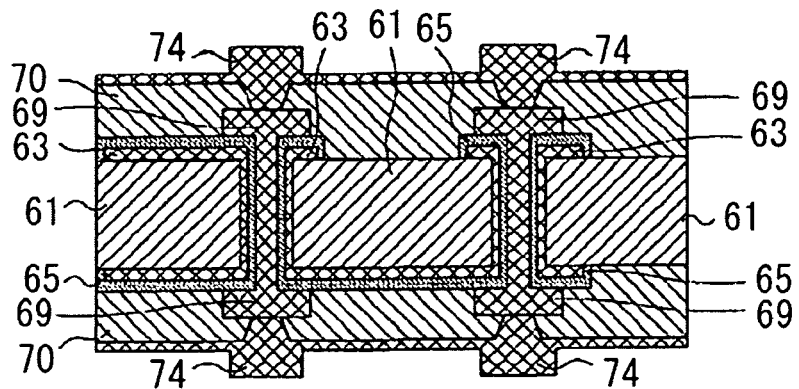
Figure 5T:
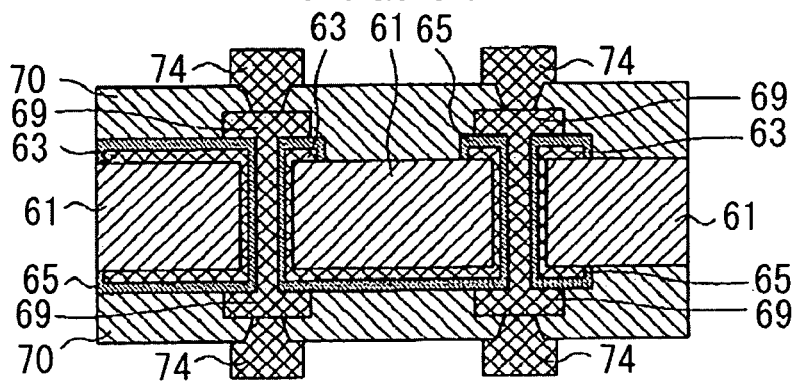

Next, the dry film resist 73 is stripped off (refer to FIG. 5S), and the copper seed layer 72 formed directly under the dry film resist 73 is removed by etching (refer to FIG. 5T).

Figure 5U:
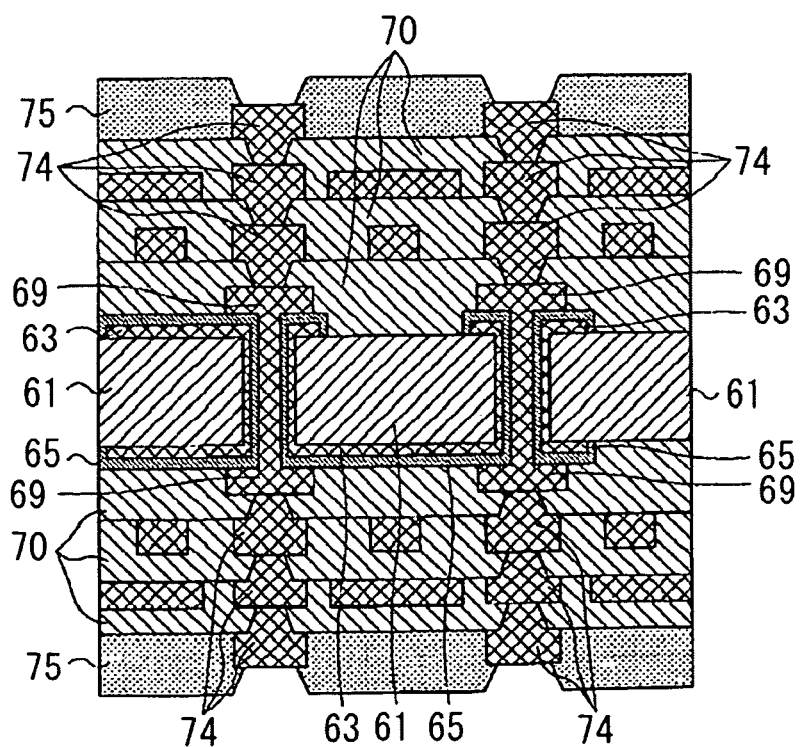

Next, the process shown in FIGS. 5N to 5T is repeated for each of a necessary number of layers (twice in the example shown in FIG. 5U), and a solder resist layer (an insulating resin film) 75 is formed in places on the insulating resin 70, which is an uppermost layer, in which the copper layer 74 is not formed. The solder resist consists of, for example, a resin such as an epoxy type, an acrylic type or a polyimide type, or a resin which is a compound thereof.

Lastly, a nickel (Ni) layer 76 and gold (Au) layer 77 are formed, in that order, by a plating process on exposed surfaces of the copper layer 74, which configure electrodes.

By so doing, a multilayer wiring substrate 80, made by the electrodeposited resin film 65 being formed by the electrodeposition method, is formed on the first conductive layer 63.

Figure 5V:
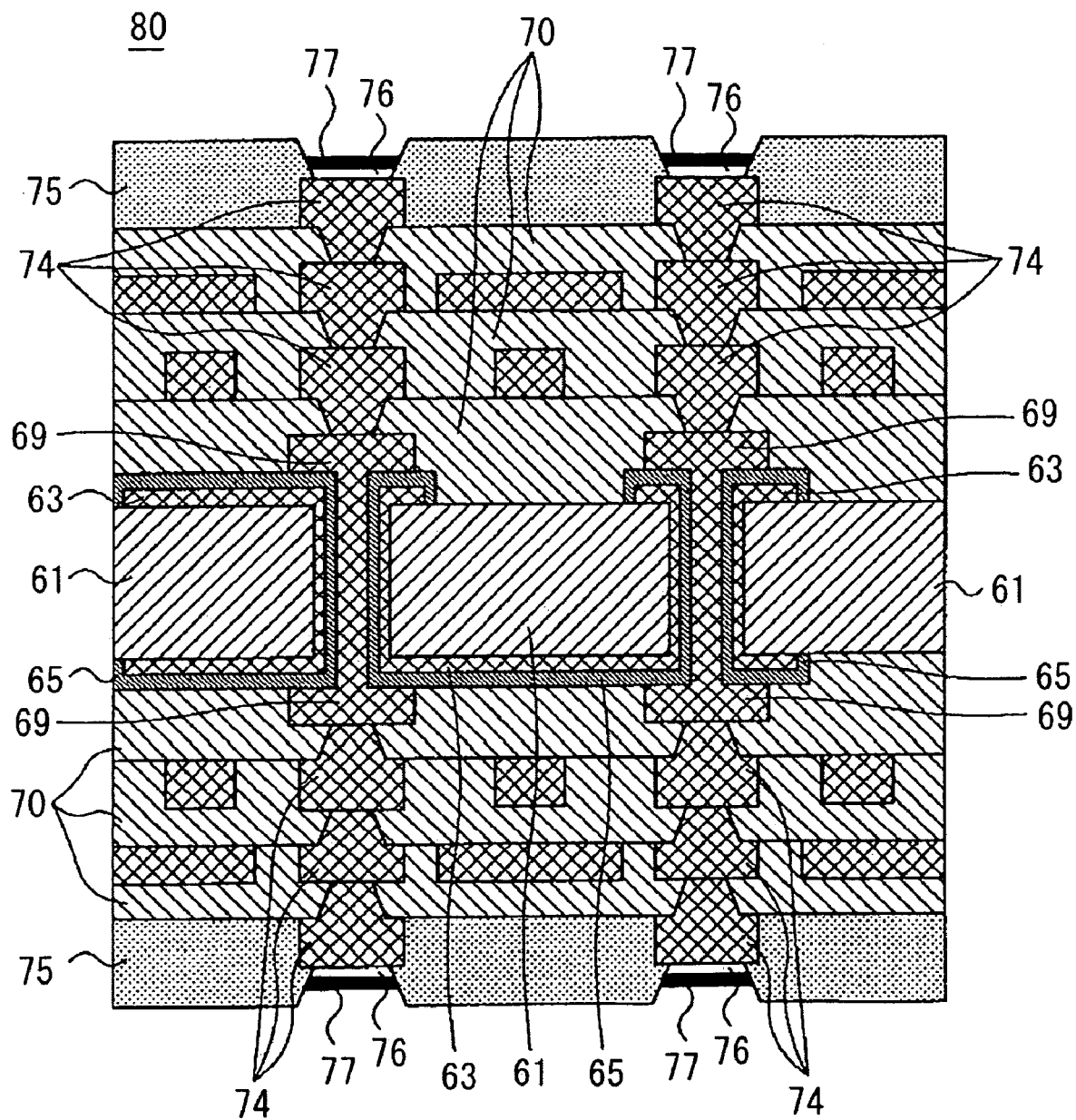

Meanwhile, although the through holes 66 are filled with the copper layer 69 in the heretofore described aspect shown in FIGS. 5A to 5V, it is also acceptable to form an insulating resin inside the through holes 66. Also, by changing a shape of the resist pattern 68 formed by the process shown in FIG. 5J, it is possible to easily change a width of the copper layer 69 on the electrodeposited resin film 65. Specifically, after carrying out the process shown in FIG. 5I, a process shown in FIGS. 6A to 6F is carried out in place of the process shown in FIGS. 5J to 5M.

After carrying out the process shown in FIG. 5I, the copper seed layer 67 (refer to FIG. 5I) is formed by the electroless plating process. Next, with the copper seed layer 67 as a seed layer, an electrolytic plating process is carried out, forming a copper layer 85 having a predetermined thickness (refer to FIG. 6A).

Next, an insulating resin layer 86, made of an insulating resin such as an epoxy resin, is loaded into the through holes 66, filling the through holes 66 (refer to FIG. 6B), and furthermore, a copper layer 87 is formed on the copper layer 85 by a plating process.

After so doing, a dry film (not shown), which is a photosensitive resin made into a film, is formed on the copper layer 87. Subsequently, by an exposure and development, a resist pattern (a dry film resist 88) is formed wherein unnecessary places are removed, and the copper layer 87 is exposed (refer to FIG. 6D). The dry film resist 88 is for eliminating areas of the copper layer 85 and copper layer 87 in which the through holes 66 are formed, and peripheries thereof. Herein, a width of a portion removed from the laminated resist 88 is set in such a way as to be greater than a width of the portion removed from the resist 68 shown in FIG. 5J.

Figure 6A:
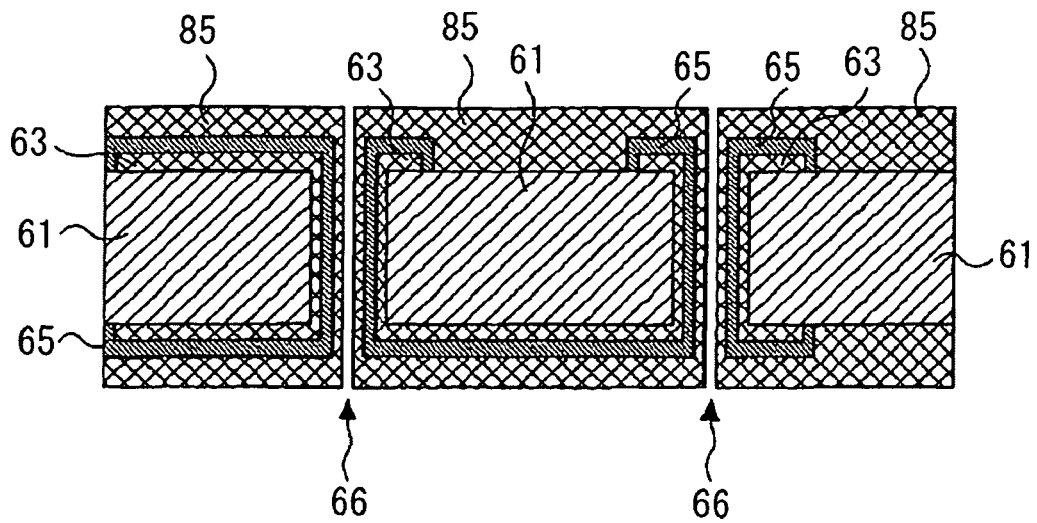
FIGS. 6A to 6F are views for illustrating another method of manufacturing a wiring substrate according to an example of an embodiment of the present invention.
Figure 6B:
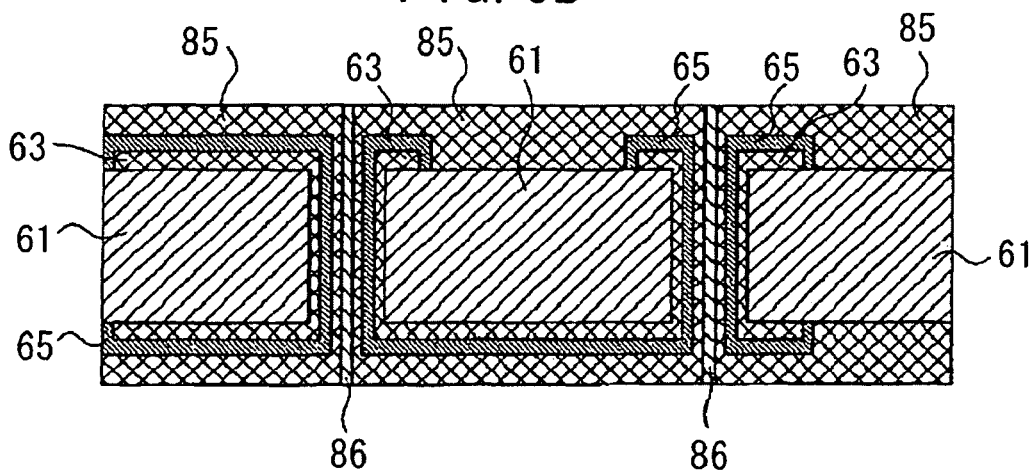
Figure 6C:
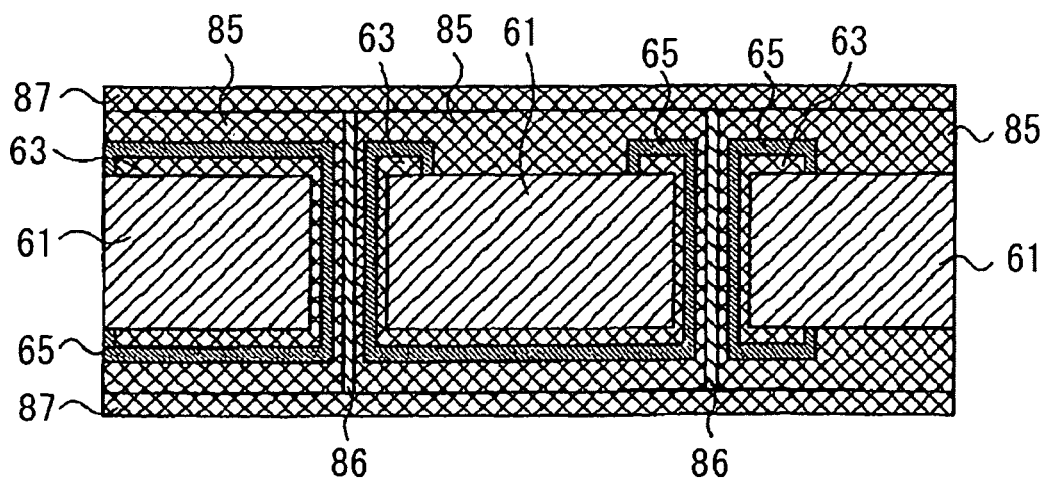
Figure 6D:
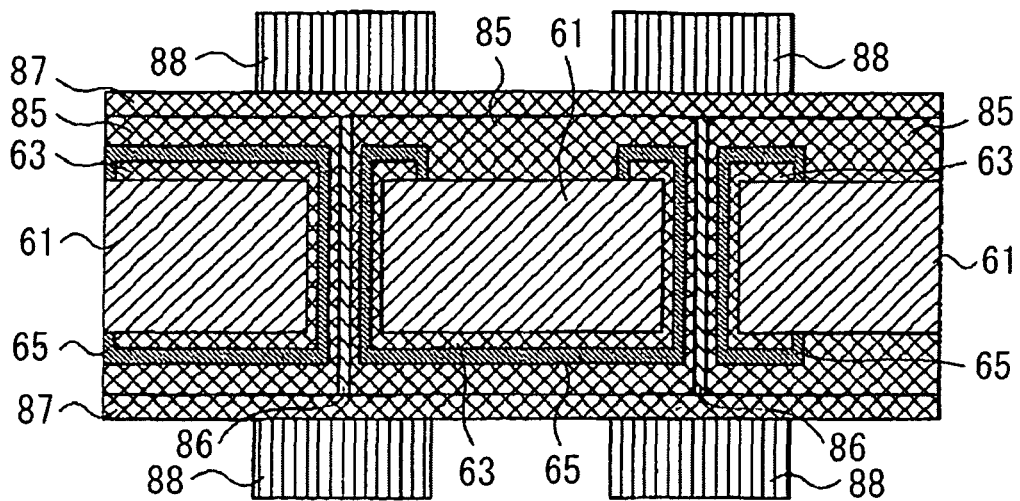
Figure 6E:
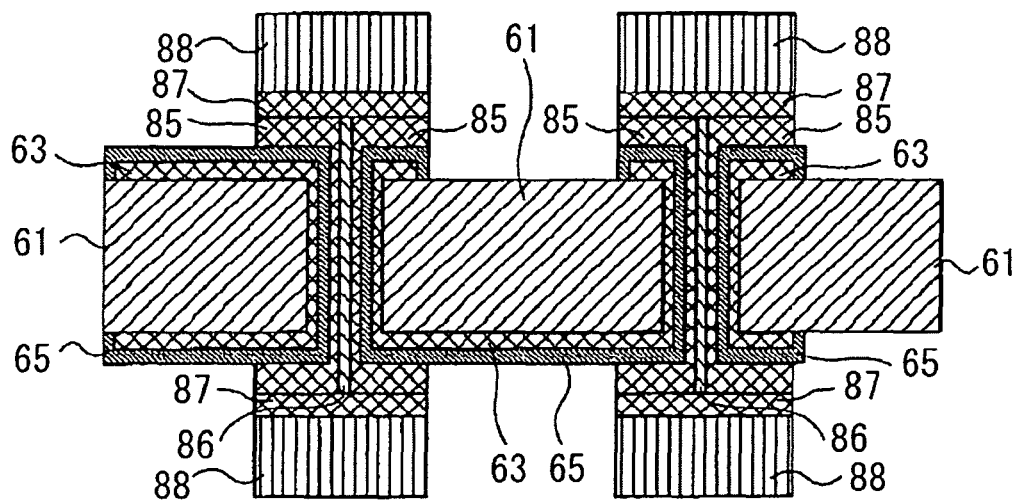
Figure 6F:
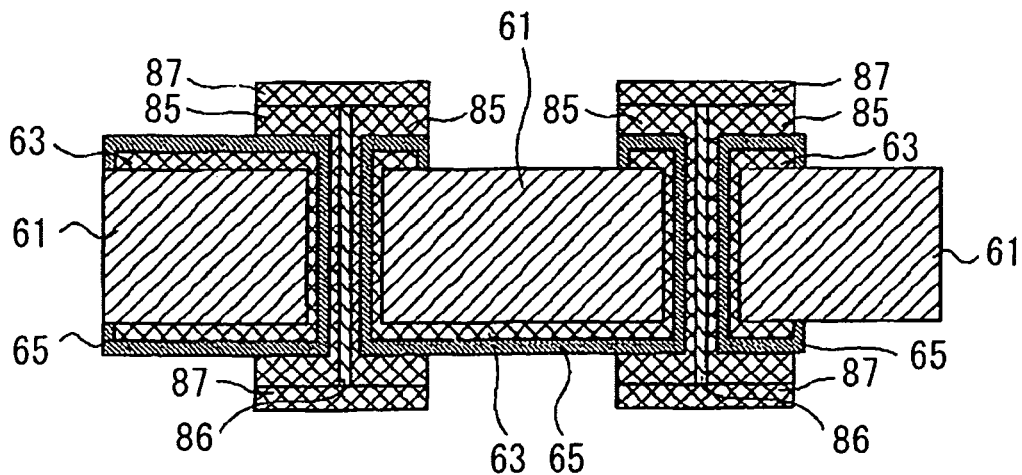

Next, areas of the copper layer 85 and the copper layer 87 on whose upper portion the dry film resist 88 is not formed are etched away (refer to FIG. 6E), after which, the dry film resist 88 is stripped off (refer to FIG. 6F).

Next, by carrying out the process shown in FIGS. 5N to 5V, it is possible to easily form a multilayer wiring substrate in which a width of the copper layer 85 and the copper layer 87 is greater than a width of the copper layer 69 shown in FIG. 5V.

Figure 7A:
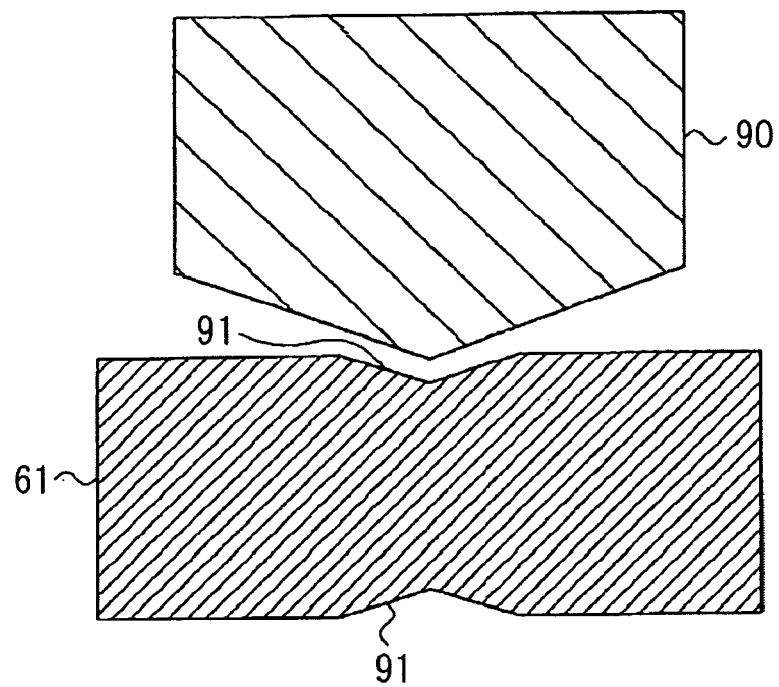
FIGS. 7A and 7B are views for illustrating another method of manufacturing a wiring substrate according to an example of an embodiment of the present invention.
Figure 7B:
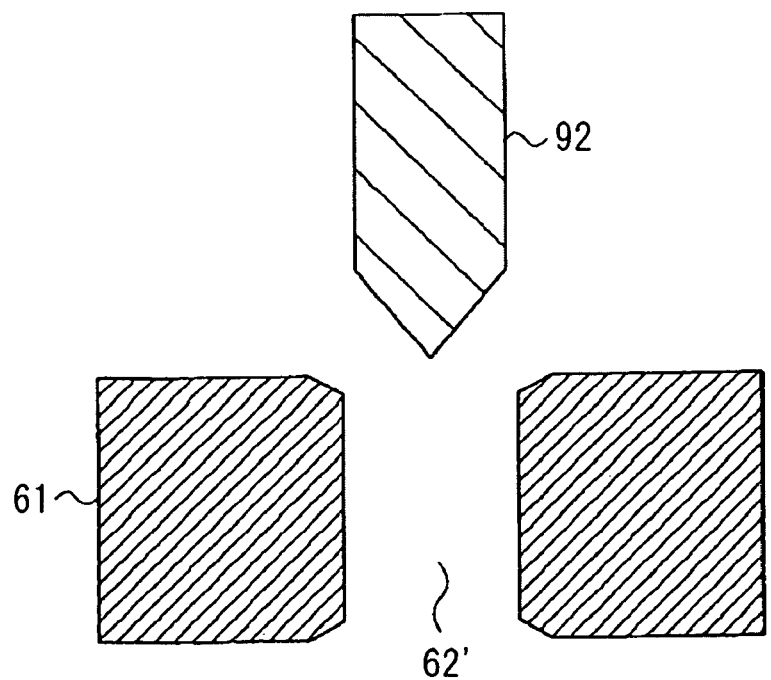
Figure 8A:
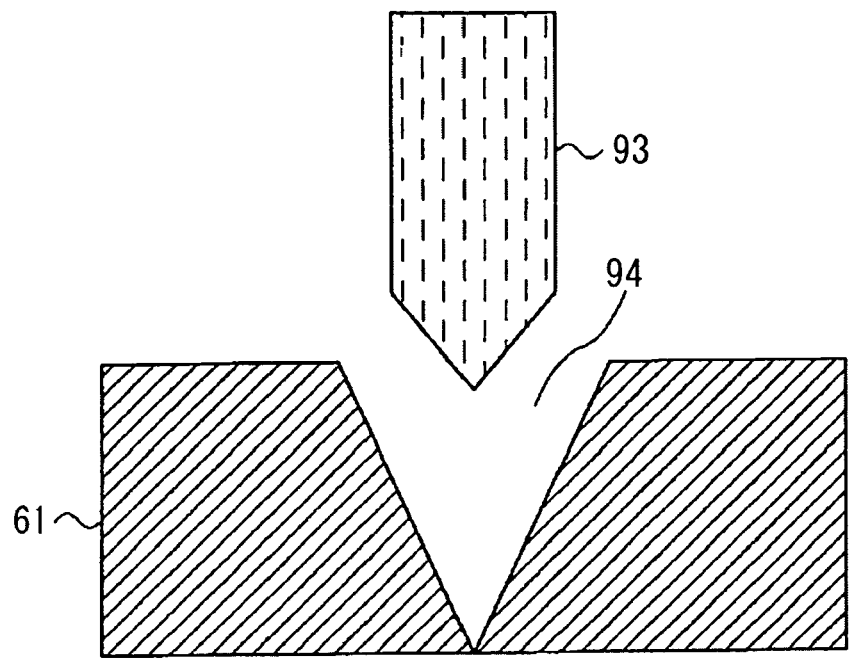
FIGS. 8A and 8B are views for illustrating a method of manufacturing a wiring substrate according to an example of an embodiment of the present invention.
Figure 8B:
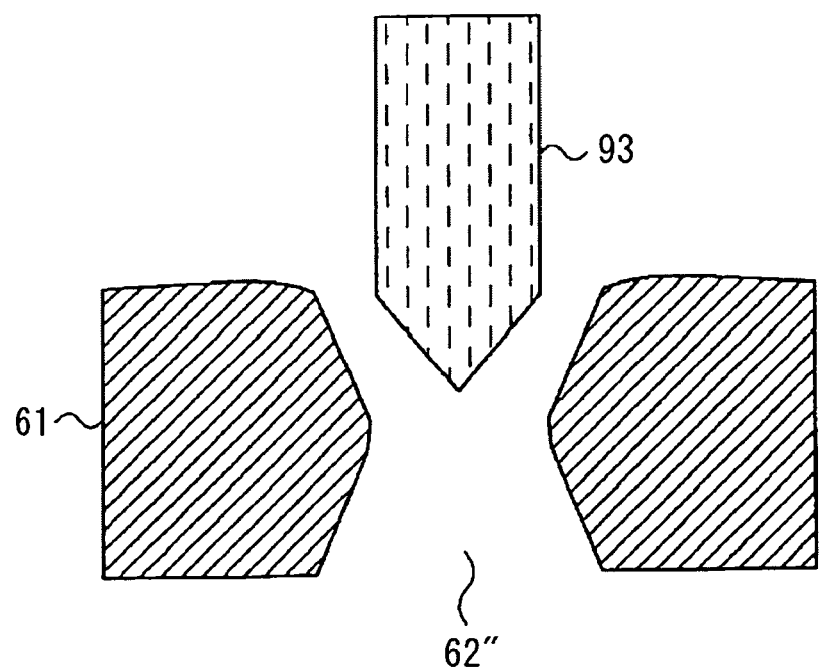

Meanwhile, in the heretofore described process shown in FIG. 5C, the clearance holes 62 having the uniform diameter Dc in all places are formed penetrating the core substrate 61 but, by using a method shown in FIGS. 7A and 7B or in FIGS. 8A and 8B, it is possible to form a clearance hole having a tapered shape in an upper surface and lower surface portion of the core substrate 61. In this case, after forming the tapered clearance hole using the method shown in FIGS. 7A and 7B or in FIGS. 8A and 8B, the first conductive layer shown in FIG. 4 is formed on the clearance hole. As a result, the first conductive layer is formed along the shape of the clearance hole. Next, an electrodeposited resin film is formed along the shape of the first conductive layer. Next, a copper layer is formed along the shape of the electrodeposited resin film. Although two clearance holes 62 are depicted in FIG. 5C, only one clearance hole is depicted in FIGS. 7A and 7B and in FIGS. 8A and 8B.

The formation of the clearance hole having the tapered shape is carried out in the following way. Firstly, after forming the core substrate 61 by the process shown in FIGS. 5A and 5B, concavities 91 having a tapered shape are formed on both surfaces of the core substrate 61, using a starting drill 90 which has an obtuse-angled leading extremity, as shown in FIG. 7A. The concavities 91 have a shape which corresponds to the leading extremity of the starting drill 90. That is, the concavities 91 have a shape which narrows from the surface of the core substrate 61 toward a center of the core substrate 61.

Next, as shown in FIG. 7B, a clearance hole 62', penetrating the core substrate 61, is formed in the concavities 91, using a drill 92 of a width smaller than that of the starting drill 90. As a result, the clearance hole 62' has a tapered shape in the upper surface and lower surface portion of the core substrate 61. The tapered shape is formed by a diameter becoming smaller from the upper surface and lower surface of the core substrate 61 toward the center of the core substrate 61.

Alternatively, it is also acceptable to arrange in such a way that, after forming the core substrate 61 by the process shown in FIGS. 5A and 5B, a YAG laser 93 is applied, as shown in FIG. 8A. With this method, firstly, the UV-YAG laser (an ultraviolet YAG laser) 93 is applied to one surface of the core substrate 61, forming an approximately V-shaped groove 94 in the core substrate 61. The UV-YAG laser 93 is one wherein a wavelength of a YAG laser has been converted by a nonlinear crystal. As UV-YAG laser 93 application conditions at this time, for example, a wavelength is set at approximately 355 nm, and an output at approximately 5 W.

Next, as shown in FIG. 8B, the heretofore described UV-YAG laser 93 is applied to the other surface of the core substrate 61. As UV-YAG laser 93 application conditions at this time, for example, the wavelength is set at approximately 355 nm, and the output at approximately 5 W.

As a result, a tapered shape is formed in a clearance hole 62" of the core substrate 61, wherein a diameter becomes smaller from the upper surface and lower surface toward the center of the core substrate 61.

Next, the process shown in FIGS. 5D to 5V is implemented on the core substrate 61 in which the clearance hole 62' or 62" is formed. As a result, the first conductive layer 63 is formed along the shape of the tapered clearance hole 62' or 62". Furthermore, the electrodeposited resin film 65 is formed along the shape of the first conductive layer 63, and the copper layer 69 is formed, along the shape of the electrodeposited resin film 65, on the electrodeposited resin film 65.

That is, in the heretofore described tapered portion, it is possible to form the first conductive layer 63, the electrodeposited resin film 65, and the copper layer 69 in a curved shape along the tapered shape. As a result, it is possible to make a thickness of the first conductive layer 63, the electrodeposited resin film 65, and the copper layer 69 in the tapered portion greater than a thickness of the first conductive layer 63, the electrodeposited resin film 65, and the copper layer 69 in the clearance hole and the through hole. Therefore, it being possible to even more reliably prevent a short circuit between the first conductive layer 63 and the copper layer 69 in the tapered portion (an external rim portion of an opening vicinity) of the clearance hole, it is possible to achieve an increase in the insulating reliability.

Description of another wiring substrate manufacturing method is provided below.

Firstly, prepregs, including a compounded approximately 0.2 mm thick carbon fiber sheet and epoxy type resin composition, are prepared. Next a plurality of, e.g., five, prepregs are laminated, and furthermore, after one each of a glass and epoxy prepreg are laminated on their exterior sides, a conductive core substrate with a thickness of about 1.0 mm is formed by pressure bonding them. As the epoxy type resin composition, a resin is used wherein, e.g., an alumina filler about 10% by weight of a whole of the composition, and a silica filler about 10% by weight of a whole of the composition, are combined. An average heat expansion rate of the conductive core substrate formed by the heretofore described method, in a temperature range of approximately 25 to approximately 200° C., is approximately 2 ppm/° C. in a planar direction, and approximately 80 ppm/° C. in a thickness direction.

After forming approximately 1,000 clearance holes with a diameter of about 0.5 mm in this kind of conductive core substrate (a conductive core base material), an electroless copper plating film and an electrolytic copper plating film are formed on the conductive core substrate.

Next, by an electrodeposition method, an insulating layer is formed on the copper plating films. Specifically, the conductive core substrate, in which the copper plating films are connected to a direct current power source, is immersed, e.g., in a polyimide electrodeposition solution. The polyimide electrodeposition solution fills a stainless steel receptacle. Next, in the condition in which the conductive core substrate is immersed in the polyimide electrodeposition solution, the copper plating films are energized for 120 seconds, e.g., by a constant voltage process, under conditions of 100 Volts and 10 Coulombs. By the energizing, a polyimide resin is caused to be deposited on the copper plating films. Subsequently, a drying process is carried out on the conductive core substrate on which the polyimide resin has been deposited. For the drying process, after first setting a temperature at about 90° C. and conducting the drying process for about 30 minutes, the temperature is set at about 180° C., and the drying process is carried out for a further about 30 minutes. As a result, the insulating layer, made of a polyimide film of which an average film thickness is about 20 mm, is formed.

A through hole, which extending between a front and rear of the substrate, is formed in the insulating layer formed by the electrodeposition method. Then, an electroless copper plating is formed on an interior wall portion of the through hole, and this is made a plating seed layer in the through hole. Furthermore, a copper plating film is formed inside the through hole by an electrolytic copper plating. This is patterned using a subtractive method, completing the portion which is to be the core of the multilayer wiring substrate.

Next, an epoxy resin sheet is formed on the front and rear of the heretofore described structure, and hardened. Next, after forming a via hole, by a laser processing, in the portion which is to be the core, a wiring is formed in the via hole using a semi-additive method. Sequentially repeating this, a build up wiring of three layers on one side, six layers on both surfaces together, is formed, completing such multilayer wiring substrate.

By creating the heretofore described multilayer wiring substrate, it has been confirmed that it is possible to reliably isolate the conductive core substrate and the wiring.

Also, it has been confirmed that it is possible to reduce the film thickness of the electrodeposited resin and to improve the uniformity of the same.

Furthermore, it has been confirmed that, by making the diameter of the clearance holes a size approximately equivalent to the diameter of the through holes, it is possible to realize a reduction of a through hole pitch.

Examples of embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made therein without departing from the spirit and scope of the present invention as set forth in the claims.

The invention claimed is:

1. A wiring substrate, comprising:
a core substrate, including a first main surface and a mutually opposing second main surface, the core substrate having a conductive property;
a first through hole which penetrates the core substrate;
a first conductive layer which extends from the first main surface to the second main surface, via the first through hole;
an insulating layer formed on the first conductive layer;
a second through hole which has the insulating layer as an interior wall, and a second conductive layer formed inside the second through hole,
wherein sidewall portions of the first through hole provide a tapered shape.

2. The wiring substrate according to claim 1, wherein the insulating layer is such that a portion providing an interior wall surface of the first through hole, and a portion providing a periphery of the first through hole, are integrally formed.

3. The wiring substrate according to claim 1, wherein the insulating layer covers an extremity of the first conductive layer.

4. The wiring substrate according to claim 1, wherein the first conductive layer and the insulating layer have a cross-section of an approximate horizontal U shape.

5. The wiring substrate according to claim 1, wherein
the first conductive layer is formed along the tapered shape of the first through hole, and the insulating layer, having a shape which follows the shape of the first conductive layer, is formed on the first conductive layer.

6. The wiring substrate according to claim 5, wherein the first conductive layer, the second conductive layer, and the insulating layer include places which are formed in a curved shape, and a thickness of the insulating layer in the places in which the tapered shape is formed is greater than a thickness of the insulating layer in another place.

7. The wiring substrate according to claim 1, wherein the second conductive layer is in contact with the insulating layer.

8. The wiring substrate according to claim 1, wherein the second through hole, having a diameter smaller than a diameter of the first through hole, is concentric with the first through hole.

9. The wiring substrate according to claim 1, wherein a resin is provided in the second through hole.

10. The wiring substrate according to claim 1, wherein an electrode is provided on the second main surface, and the electrode is connected to a wiring portion of the second through hole.

11. The wiring substrate according to claim 1, wherein an insulating portion is formed between the core substrate and the first conductive layer.

12. The wiring substrate according to claim 1, wherein a constituent material of the core substrate is selected from a group configured of carbon fiber, a carbon nanotube, a 36 alloy, and a 42 alloy.

13. The wiring substrate according to claim 1, wherein the insulating layer is an electrodeposited resin.

14. The wiring substrate according to claim 13, wherein the resin is an epoxy type resin or a polyimide type resin.

15. A wiring substrate manufacturing method, comprising:
forming a first through hole in a core substrate, including a first main surface and a mutually opposing second main surface, the second surface having a conductive property, sidewall portions of the first through hole providing a tapered shape;
forming a first conductive layer which extends from the first main surface to the second main surface, via the first through hole;
forming, by electrodeposition, an insulating layer on the first conductive layer;
forming a second through hole which has the insulating layer as an interior wall, and extends between the first main surface and the second main surface, and forming a second conductive layer inside the second through hole.

16. The wiring substrate manufacturing method according to claim 15, wherein the forming of the first conductive layer includes an electroless plating process.

17. The wiring substrate manufacturing method according to claim 15, wherein the forming of the second conductive layer includes:
forming a conductive seed layer on the insulating layer;
patterning the conductive seed layer; and
plating the patterned conductive seed layer to form the second conductive layer.

18. The wiring substrate manufacturing method according to claim 15, wherein the forming of the first through hole includes:
forming, by a drilling process, tapered portions of the sidewalls that extend between the first main surface and the second main surface of the core substrate.

19. The wiring substrate manufacturing method according to claim 15, wherein the step forming of the first through hole includes:
tapering, by laser processing, tapered portions of the sidewalls that extend between the first main surface and the second main surface.

20. The wiring substrate manufacturing method according to claim 18, wherein:
the forming of the first conductive layer includes locating the first conductive layer along the tapered shape; and
the forming of the insulating layer includes configuring the insulating layer with a shape which follows the shape of the first conductive layer.

* * * * *